(12) United States Patent
Fuse et al.

(10) Patent No.: US 9,318,320 B2
(45) Date of Patent: Apr. 19, 2016

(54) PRODUCTION METHOD FOR ACTIVE ELEMENT SUBSTRATE, ACTIVE ELEMENT SUBSTRATE, AND DISPLAY DEVICE

(71) Applicant: Sharp Kabushiki Kaisha, Osaka (JP)

(72) Inventors: Daisuke Fuse, Osaka (JP); Masaya Yamamoto, Osaka (JP); Naoki Takao, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/438,141

(22) PCT Filed: Oct. 21, 2013

(86) PCT No.: PCT/JP2013/078463
§ 371 (c)(1),
(2) Date: Apr. 23, 2015

(87) PCT Pub. No.: WO2014/065235
PCT Pub. Date: May 1, 2014

(65) Prior Publication Data
US 2015/0294861 A1    Oct. 15, 2015

(30) Foreign Application Priority Data

Oct. 26, 2012  (JP) ................................. 2012-237194

(51) Int. Cl.
| H01L 21/00 | (2006.01) |
| H01L 21/02 | (2006.01) |
| H01L 27/12 | (2006.01) |

(52) U.S. Cl.
CPC ........ *H01L 21/02288* (2013.01); *H01L 27/124* (2013.01); *H01L 27/1248* (2013.01); *H01L 27/1292* (2013.01); *H01L 27/1296* (2013.01)

(58) Field of Classification Search
USPC ........................ 257/386, 414, 428; 438/48, 57
See application file for complete search history.

(56) References Cited

U.S. PATENT DOCUMENTS

| 5,380,555 A | 1/1995 | Mine et al. |
| 2002/0042025 A1 | 4/2002 | Tokai et al. |
| 2007/0128760 A1 | 6/2007 | Subramanian et al. |
| 2007/0138469 A1 | 6/2007 | Yoshimoto |
| 2007/0268438 A1 | 11/2007 | Nakamura et al. |

FOREIGN PATENT DOCUMENTS

| JP | H6-240455 A | 8/1994 |
| JP | 7-218929 A | 8/1995 |
| JP | H10-102003 A | 4/1998 |
| JP | 2001-98224 A | 4/2001 |
| JP | 2002-117756 A | 4/2002 |
| JP | 2007-171314 A | 7/2007 |
| JP | 2007-184552 A | 7/2007 |
| JP | 2008-46441 A | 2/2008 |
| WO | 2006/022259 A1 | 3/2006 |

OTHER PUBLICATIONS

Choi et al., "Performance of TFT passivated with low-K dielectries", The Proceedings of The 10th International Display Workshops (IDW'03), 2003, p. 617-620.

*Primary Examiner* — Errol Fernandes
(74) *Attorney, Agent, or Firm* — Chen Yoshimura LLP

(57) ABSTRACT

The present invention provides a method of manufacturing an active element substrate aimed at reducing the production costs of an interlayer insulating film made from a spin-on glass material, for example. In the method of manufacturing an active element substrate, an interlayer insulating film is formed using a printing method that employs a plate. The plate includes: a main pattern that overlaps with signal lines that enclose openings; and fine line patterns that reduce, in the widthwise direction of the signal lines, the inclination of the edges of the printed pattern printed by the main pattern.

11 Claims, 12 Drawing Sheets

(a)

(b)

(a) Process for producing active element substrate (b) Conventional process for forming interlayer insulating film (SOG)

(c) Process for forming interlayer insulating film (SOG) of the present invention (a)

(b)

(a) Relief plate (b) Intaglio plate (a) Image of a single pixel in a display state in which light is allowed to pass through (b) Image of panel in an illuminated state Near edges of SOG pattern, orientation of liquid crystal molecules is disrupted and transmittance is reduced.

(a) Image of a single pixel in a display state in which light is allowed to pass through (b) Image of panel in an illuminated state Edges of SOG pattern are tapered gently.
Orientation of liquid crystal molecules is not disrupted,
and transmittance is not reduced.

(a)

(b)

(a)

(b)

(a)

(b)

(a) Image of a single pixel in a display state in which light is allowed to pass through (b) Image of panel in an illuminated state Edges of SOG pattern are tapered gently.
Orientation of liquid crystal molecules is not disrupted,
and transmittance is not reduced.

PRODUCTION METHOD FOR ACTIVE ELEMENT SUBSTRATE, ACTIVE ELEMENT SUBSTRATE, AND DISPLAY DEVICE

TECHNICAL FIELD

The present invention relates to an active element substrate, a method of manufacturing the active element substrate, and a display device.

BACKGROUND ART

In recent years, high frequency driving methods for liquid crystal display devices have been researched in pursuit of improvements in video display performance and higher display resolutions. However, the liquid crystal display panels used in conventional liquid crystal display devices suffer from parasitic capacitance, which can result in distortion of display signals. As a result, a high enough driving frequency cannot be achieved in these conventional liquid crystal display devices. Several technologies that aim to combat these problems by reducing the capacitance formed at the intersections between the scanning lines and the signal lines in such devices have been developed. For example, Patent Document 1 discloses a technology in which a film made from a spin-on glass (SOG) material is formed between the scanning lines and the signal lines.

Moreover, Patent Document 2 discloses a method of manufacturing a relief printing plate for use in production of an organic electroluminescent display, for example. In the technology disclosed in Patent Document 2, a photolithography method in which a photosensitive resin is used for the resin material is used to produce a relief printing plate. The manufacturing method disclosed in Patent Document 2 (see FIG. 15) includes: forming a photocurable photosensitive resin layer 202 on a base material 200; forming a light diffusing layer 201 on top of the photosensitive resin layer 202; exposing the photosensitive resin layer 202 to light that first passes through the light diffusing layer 201; and developing the photosensitive resin layer 202 to remove the unexposed portions 202a. In the exposure step, a photomask 206 in which light-shielding portions 205 are patterned on a mask base material 204 is used. In the exposure step, the relief printing plate is proximity-exposed using the photomask 206. Light passes through light-transmitting portions of the photomask 206 in which the light-shielding portions 205 are not formed. This transmitted light is then diffused by fine light-diffusing particles contained in the light diffusing layer 201. As a result, the photosensitive resin layer 202 is exposed to light not only from the vertical direction but also from a slanted direction. Therefore, the photocured portions 202b of the photosensitive resin layer 202 can be formed in a pattern of forward-tapered protrusions according to the pattern used for the light-shielding portions 205 of the photomask 206. Furthermore, when the photomask 206 is removed, the relief printing plate is developed to remove the uncured unexposed portions 202a of the photosensitive resin layer 202, which were not exposed to light during the exposure step. In this way, a relief printing plate with a pattern of forward-tapered protrusions that widen towards the base material 200 is produced. Moreover, the angle of inclination θ of the protrusions with respect to the surface of the base material 200 is controlled by adjusting the concentration and the particle diameter of the fine light-diffusing particles in the light diffusing layer 201.

RELATED ART DOCUMENTS

Patent Documents

Patent Document 1: WO Publication, "WO 2006/022259 (Published on Mar. 2, 2006)"
Patent Document 2: Japanese Patent Application Laid-Open Publication, "Japanese Patent Application Laid-Open Publication No. 2008-46441 (Published on Feb. 28, 2008)"

SUMMARY OF THE INVENTION

Problems to be Solved by the Invention

However, in the technology disclosed in Patent Document 1, the SOG interlayer insulating film is patterned using photolithography and dry etching. The equipment and materials needed to form the SOG interlayer insulating film using this method are expensive. Therefore, this manufacturing method comes with a high associated production cost.

The present invention was made in view of such problems, and one aspect of the present invention provides: a method of manufacturing an active element substrate that can reduce the cost of manufacturing an interlayer insulating film made from an SOG material, for example; an active element substrate produced using that manufacturing method; and a display device equipped with that active element substrate.

Means for Solving the Problems

In order to solve the abovementioned problems, one aspect of the present invention is a method of manufacturing an active element substrate that has a plurality of scanning lines formed on a substrate, a plurality of signal lines that intersect with the scanning lines, and a plurality of light-transmissive portions in regions enclosed by the scanning lines and the signal lines, the method including: preparing the substrate having the plurality of the scanning lines, the plurality of the signal lines, and the plurality of the light-transmissive portions, and printing an interlayer insulating film at intersections between the scanning lines and the signal lines, using a relief plate or an intaglio plate, wherein the relief plate or the intaglio plate has: a main pattern at locations overlapping the respective signal lines; and edge-softening patterns that reduce, in a widthwise direction of the signal lines, an inclination of edges of a pattern printed by the main pattern.

Moreover, in order to solve the abovementioned problems, one aspect of the present invention is an active element substrate, including: a plurality of scanning lines formed on a substrate; a plurality of signal lines that intersect with the scanning lines; a plurality of light-transmissive portions in regions enclosed by the scanning lines and the signal lines; and an interlayer insulating film formed at intersections between the scanning lines and the signal lines, wherein the interlayer insulating film is printed by a relief plate or an intaglio plate including: a main pattern at locations overlapping the respective signal lines; and edge-softening patterns that reduce, in a widthwise direction of the signal lines, an inclination of edges of a pattern printed by the main pattern so that the interlayer insulating film has reduced inclination at the edges.

Effects of the Invention

One aspect of the present invention can reduce the cost of manufacturing an interlayer insulating film made from an SOG material, for example.

BRIEF DESCRIPTION OF THE DRAWINGS

FIG. 3(a) shows the overall method of manufacturing an active element substrate. FIG. 3(b) shows the steps used in a conventional process for forming an interlayer insulating film (SOG film). FIG. 3(c) shows the steps used in a process for forming an interlayer insulating film (SOG film) of the present invention.

FIG. 5(a) illustrates the configuration of a relief plate, and FIG. 5(b) illustrates the configuration of an intaglio plate.

FIG. 6(a) is a plan view image showing a single pixel in a display state in which light is allowed to pass through, and FIG. 6(b) is a plan view image showing the panel in an illuminated state.

FIG. 7(a) is a plan view image showing a single pixel in a display state in which light is allowed to pass through, and FIG. 7(b) is a plan view image showing the panel in an illuminated state.

FIG. 10(a) also includes an enlarged plan view of small protrusion patterns in the plate. FIG. 10(b) also includes an enlarged plan view of a portion of the interlayer insulating film patterned by the small protrusion patterns.

FIG. 12(a) is a plan view image showing a single pixel in a display state in which light is allowed to pass through, and FIG. 12(b) is a plan view image showing the panel in an illuminated state.

DETAILED DESCRIPTION OF EMBODIMENTS

Embodiments of the present invention will be described in detail below with reference to figures. However, characteristics of these embodiments such as the dimensions, materials, shapes, and relative arrangements of components described below are intended only as examples. The present invention shall not be interpreted as being limited to these examples.

(Embodiment 1)

Figure 1:
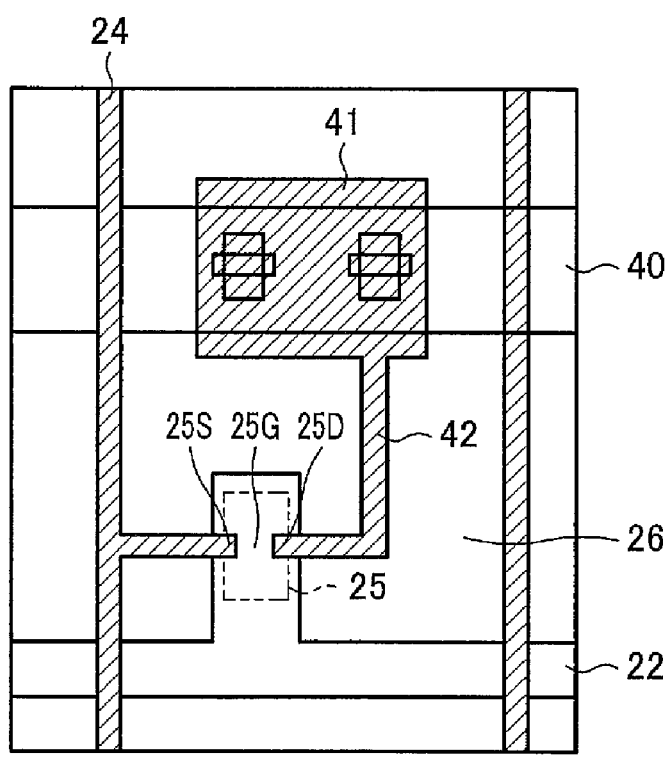
FIG. 1 is a plan view illustrating a single pixel region of an active element substrate produced using a manufacturing method according to Embodiment 1 of the present invention.

An embodiment of the present invention will be described in detail below. FIG. 1 is a plan view illustrating a single pixel region of an active element substrate 20 according to the present embodiment. FIG. 2(a) is a plan view illustrating the configuration of an intersection between a scanning line and a signal line in the active element substrate 20 shown in FIG. 1. FIG. 2(b) is a cross-sectional view illustrating the configuration of a liquid crystal display device 1 equipped with the active element substrate 20. The cross section shown in FIG. 2(b) is taken along line (A)-(A') in FIG. 2(a).

In the present embodiment, TFTs are used for the active elements in the active element substrate 20, for example. Moreover, the liquid crystal display device 1 is described as an example of a display device equipped with the active element substrate 20. However, the active element substrate of the present invention is not limited to these examples. The present invention includes active element substrates provided with other types of well-known active elements in addition to active element substrates provided with TFTs. Moreover, the display device of the present invention is not limited to the liquid crystal display device 1. The present invention includes display devices provided with other types of well-known display technologies in addition to display devices equipped with a liquid crystal display technology.

As shown in FIG. 2(b), the liquid crystal display device 1 includes the active element substrate 20, an opposite substrate 4, and a liquid crystal layer 3 sandwiched between the active element substrate 20 and the opposite substrate 4. The liquid crystal layer 3 is sandwiched between an alignment film 20a provided on the active element substrate 20 and an alignment film 4a provided on the opposite substrate 4.

Moreover, the active element substrate 20 includes: a transparent, insulating substrate 21 (such as a glass substrate); a plurality of scanning lines 22 formed on the substrate 21; an interlayer insulating film 23 that is formed to cover a portion of the scanning lines 22; and a plurality of signal lines 24 that are formed on top of the interlayer insulating film 23 and intersect with the scanning lines 22.

As shown in FIG. 1, the active element substrate 20 further includes, in each pixel region: a thin film transistor (TFT) 25 that serves as the active element and responds to signals applied to the corresponding scanning line 22; and a pixel electrode 26 that is electrically connected to the corresponding signal line 24 via the TFT 25. Moreover, the TFT 25 includes: a gate electrode 25G that is electrically connected to the scanning line 22; a source electrode 25S that is electrically connected to the signal line 24; and a drain electrode 25D that is electrically connected to the pixel electrode 26.

Moreover, the active element substrate 20 further includes: a plurality of auxiliary capacitance lines 40 formed on the substrate 21; and a plurality of auxiliary capacitance electrodes 41 that are formed on the interlayer insulating film 23 and face the plurality of auxiliary capacitance lines 40. The auxiliary capacitance lines 40 are formed by patterning the same conductive film used to form the scanning lines 22 and the gate electrodes 25G. The auxiliary capacitance electrodes 41 are formed by patterning the same conductive film used to form the signal lines 24, the source electrodes 25S, and the drain electrodes 25D. Moreover, as shown in FIG. 1, each auxiliary capacitance electrode 41 is electrically connected to the drain electrode 25D of the TFT 25 via a conductive member 42 that extends out from the drain electrode 25D.

The alignment state of the liquid crystal layer 3 changes according to the voltage applied to the pixel electrodes 26 and an opposite electrode (not shown in the figures) of the opposite substrate 4. The liquid crystal display device 1 displays an image by modulating light that passes through the liquid crystal layer 3. Any of a wide variety of liquid crystal layers configured to achieve different display modes can be used for the liquid crystal layer 3. A twisted nematic (TN) liquid crystal layer that takes advantage of the optical rotation of light or an electrically controlled birefringence (ECB) liquid crystal layer that takes advantage of the birefringence of liquid crystals can be used, for example. Within the category of ECB liquid crystal layers, vertical alignment (VA) modes in particular can be used to achieve a high contrast ratio. VA liquid crystal layers are typically constructed by sandwiching a liquid crystal layer containing a liquid crystal material that exhibits negative dielectric anisotropy between two vertical alignment layers.

Moreover, as shown in FIG. 2(b), a gate insulating (GI) film 27 is formed on the interlayer insulating film 23 of the active element substrate 20. The signal lines 24 are formed on top of the gate insulating film 27 and intersect with the scanning lines 22. Next, on top of the layered assembly described above, a passivation film 28 made from silicon nitride or silicon oxide, a transparent insulating film (JAS) 29, a transparent conductive film 30 made from indium tin oxide or zinc oxide, and the alignment film 20a are layered in order. Moreover, the thickness of the scanning lines 22 is typically approximately 0.7 µm. Moreover, the thickness of the gate insulating film 27 is typically approximately 0.3 µm. Moreover, the thickness of the passivation film 28 is typically approximately 0.2 µm. Moreover, the thickness of the signal lines 24 is typically approximately 0.6 µm. Moreover, the thickness of the transparent insulating film 29 is typically approximately 2.3 µm. Moreover, the thickness of the transparent conductive film 30 is typically approximately 0.1 µm. Moreover, the thickness of the alignment film 20a is typically approximately 0.1 µm.

As described above, in the active element substrate 20, the interlayer insulating film 23 is formed to cover a portion of the scanning lines 22. The interlayer insulating film can either be formed along the signal lines 24 or only at the intersections between the scanning lines 22 and the signal lines 24. Typically, it is preferable that the thickness of the interlayer insulating film 23 be at least 1.0 µm but no more than 4.0 µm. Moreover, the interlayer insulating film 23 is formed using an insulating material that contains an organic ingredient.

This reduces the (parasitic) capacitance that forms at the intersections between the scanning lines 22 and the signal lines 24. As a result, latency in the source signals due to this (parasitic) capacitance can be reduced.

A spin-on glass material that contains an organic ingredient (a so-called organic SOG material) can be used as appropriate as the material for the interlayer insulating film 23. In particular, an SOG material in which an Si—O—C bond acts as the skeleton for the material or an SOG material in which an Si—C bond acts as the skeleton for the material can be used. An SOG material is a material with which a glass film (silica film) can be formed using an application method such as spin coating. Organic SOG materials have a low dielectric constant and are well-suited to forming thick films. Therefore, using an organic SOG material as the material for the interlayer insulating film 23 gives the interlayer insulating film 23 a low dielectric constant and makes it easy to make the interlayer insulating film 23 thick. Examples of SOG materials in which an Si—O—C bond acts as the skeleton for the material include the materials disclosed in Japanese Patent Application Laid-Open Publication No. 2001-98224 and Japanese Patent Application Laid-Open Publication No. 1994-240455 as well as the DD1100 material made by Dow Corning Toray Silicone Co., Ltd. and disclosed on page 617 of the Proceedings of The 10th International Display Workshops (IDW'03). Moreover, one example of an SOG material in which an Si—C bond acts as the skeleton for the material is the material disclosed in Japanese Patent Application Laid-Open Publication No. 1998-102003.

Figure 2:
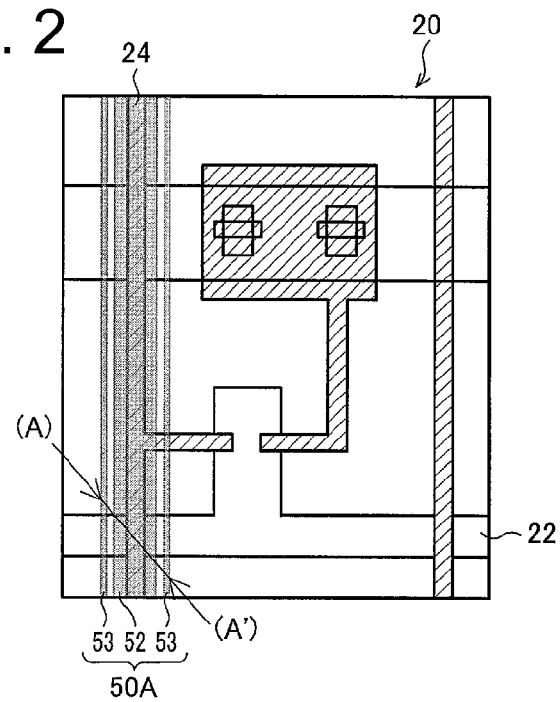
FIG. 2(a) is a plan view illustrating the configuration of an intersection between a scanning line and a signal line in the active element substrate shown in FIG. 1.
FIG. 2(b) is a cross-sectional view illustrating the configuration of a liquid crystal display device equipped with the active element substrate shown in FIG. 2(a).
Figure 2:
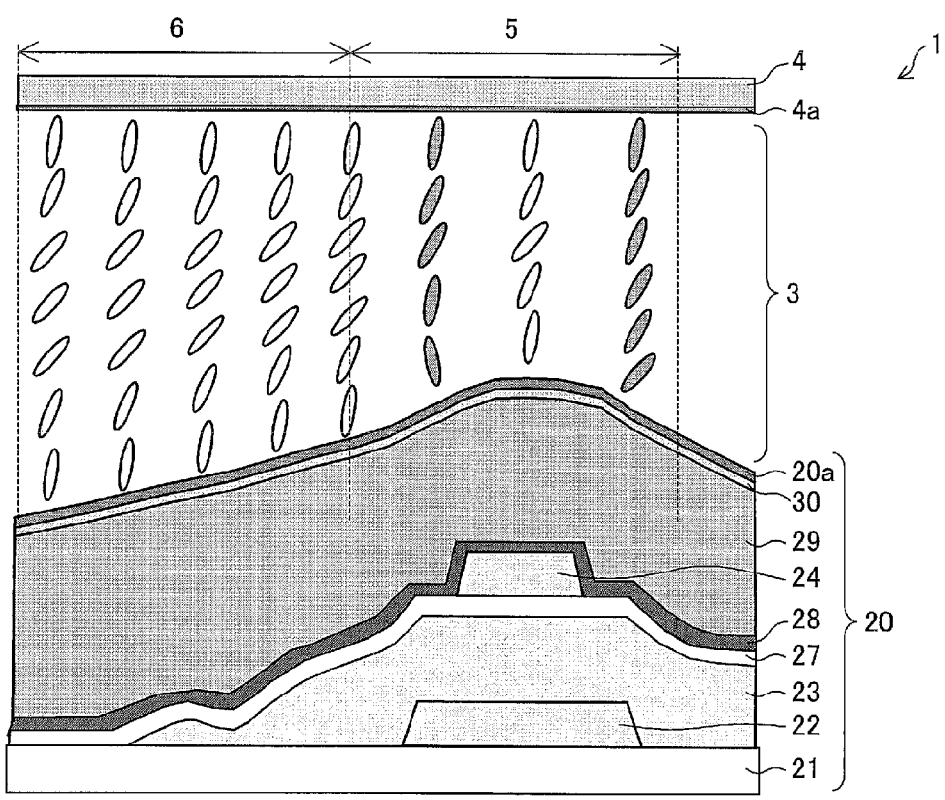

Moreover, although it is not shown in FIG. 1 or 2, a black matrix (light-shielding film) is formed on the active element substrate 20 such that the black matrix covers the front surfaces of the scanning lines 22, the signal lines 24, and the active elements 25. In this way, light-shielding portions 5 that block light and openings 6 that allow light to pass through are formed in the liquid crystal display device 1.

Figure 3:
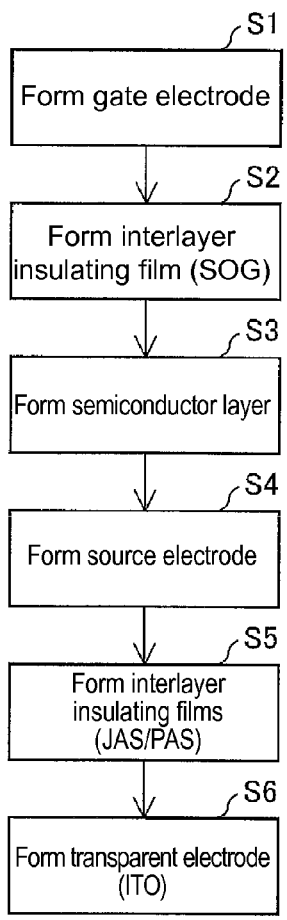
FIG. 3 is a flowchart showing an overview of methods for manufacturing an active element substrate.
Figure 3:
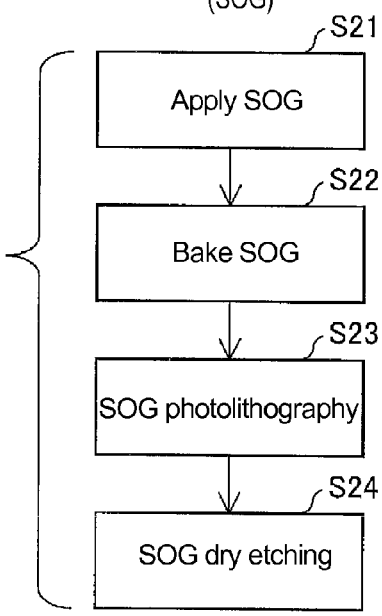
Figure 3:
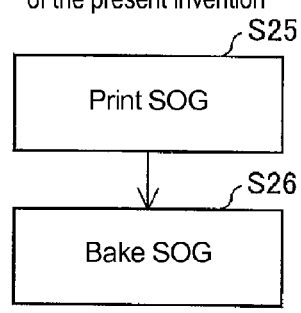

Next, an example of a method of manufacturing the active element substrate 20 will be described. FIG. 3 is a flowchart showing an overview of methods for manufacturing the active element substrate 20. FIG. 3(a) shows the overall method of manufacturing the active element substrate 20. FIG. 3(b) shows the steps used in a conventional process for forming an interlayer insulating film (SOG film). FIG. 3(c) shows the steps used in a process for forming the interlayer insulating film (SOG film) of the present invention.

As shown in FIG. 3(a), in a gate electrode formation step S1, a gate pattern that includes the gate electrodes 25G, the scanning lines 22, and the auxiliary capacitance lines 40 is formed on a substrate 10. A well-known technology can be used for the gate electrode formation step S1, and therefore further description of this step will be omitted here.

Next, in an interlayer insulating film (SOG film) formation step S2 (an organic insulating film formation step), the interlayer insulating film 23 is formed on the scanning lines 22. In the interlayer insulating film (SOG film) formation step S2, the interlayer insulating film 23 can either be formed along the signal lines 24 that enclose the openings 6 or only at the intersections between the scanning lines 22 and the signal lines 24. This interlayer insulating film (SOG film) formation step S2 will be described in further detail later.

Next, a semiconductor layer formation step S3 and a source electrode formation step S4 are performed. Then, in an interlayer insulating film (JAS/PAS) formation step S5, a passivation film 28 made from silicon nitride or silicon oxide and a transparent insulating film (JAS) 29 are formed in order. Finally, in a transparent electrode (ITO) formation step S6, a transparent conductive film 30 made from indium tin oxide or zinc oxide is formed. Well-known technologies can be used for the semiconductor layer formation step S3, the source electrode formation step S4, the interlayer insulating film (JAS/PAS) formation step S5, and the transparent electrode (ITO) formation step S6, and therefore further description of these steps will be omitted here.

Next, a conventional process for forming an interlayer insulating film (SOG film) will be described. In the conventional process for forming an interlayer insulating film (SOG film), an insulating film material (SOG) would be applied to the scanning lines 22, and then photolithography and dry etching would be used to pattern the insulating film material (SOG).

More specifically, as shown in FIG. 3(b), in an SOG application step S21, an organic SOG material would be applied to the substrate 21 using spin coating. Next, in an SOG baking step S22, the substrate would be pre-baked and post-baked to form the interlayer insulating film 23. Then, in an SOG photolithography process S23, prescribed sections of the interlayer insulating film 23 would be removed using photolithography. Finally, in an SOG dry etching step S23, the substrate would be dry-etched using a mixed gas containing carbon tetrafluoride ($CF_4$) and oxygen ($O_2$).

The conventional interlayer insulating film (SOG film) formation process illustrated in FIG. 3(b) has several advantages. For instance, the minimum line width that can be achieved in the pattern used for the interlayer insulating film 23 is quite small, and the precision with which the lines can be placed is high. However, this conventional process also comes with high production costs because both the equipment and materials needed to form the interlayer insulating film 23 are expensive.

The present invention was made in view of such problems and aims to provide a technology with which such costs can be reduced. In the process for forming the interlayer insulating film (SOG film) of the present invention, the interlayer insulating film 23 is patterned using a printing method in which a relief plate or an intaglio plate is used.

When using such a printing method in which a relief plate or an intaglio plate is used to pattern the interlayer insulating film 23, the minimum line width and the precision with which the lines can be placed are roughly 10 times worse than in the conventional process described above in which photolithography and dry etching steps are used. More specifically, when using the printing method, the minimum line width is 15 µm to 30 µm, and the positioning precision is ±10 µm.

This being the case, when using a printing method in which a relief plate or an intaglio plate is used to pattern the interlayer insulating film 23, the pattern must be designed with sufficient tolerances in order to allow for positioning errors in the pattern. In other words, in order to prevent problems that might occur due to positioning errors in the pattern, the pattern must be designed such that the interlayer insulating film 23 does not overlap with the TFTs 25 or the auxiliary capacitance lines 40 even if a positioning error were to occur. Patterns that meet these design requirements include patterns that are printed along the signal lines 24 and patterns that are only printed at the intersections between the scanning lines 22 and the signal lines 24.

FIG. 4(a) is a plan view illustrating the configuration of an active element substrate 20 in which a printing method is used to create a printed pattern along the signal lines 24. FIG. 4(b) is a cross-sectional view illustrating the configuration of a liquid crystal display device 1' equipped with the active element substrate 20 shown in FIG. 4(a). The cross section shown in FIG. 4(b) is taken along line (A)-(A') in FIG. 4(a).

In the active element substrate 20 shown in FIG. 4(a), a plate 50' is used as the relief plate or the intaglio plate for forming the interlayer insulating film 23. The plate 50' is patterned such that the interlayer insulating film 23 is formed along the signal lines 24.

As shown in FIG. 4(b), in an interlayer insulating film 23' patterned using a printing method in which the plate 50' is used, the edges of the interlayer insulating film 23' extend past the light-shielding portion 5 in the widthwise direction of the signal line 24 (that is, the edges extend into the openings 6). In other words, the edges of the interlayer insulating film 23' are not contained within the light-shielding portion 5 and extend past the boundaries between the light-shielding portion 5 and the openings 6. Moreover, the edges of the interlayer insulating film 23' are inclined steeply, with a taper angle of approximately 60°.

As a result, in the active element substrate 20 obtained after forming, in order, a gate insulating film 27', a passivation film 28', signal lines 24', a transparent insulating film 29', and an alignment film 20a', the surface of the active element substrate 20 that is in contact with the liquid crystal layer 3 is inclined steeply in the boundary regions between the openings 6 and the light-shielding portions 5. More specifically, the surface of the active element substrate 20 that is in contact with the liquid crystal layer 3 has a taper angle of approximately 30° in the boundary regions between the openings 6 and the light-shielding portions 5. As a result, the orientation of the liquid crystal molecules in the liquid crystal layer 3 is disrupted in the boundary regions between the openings 6 and the light-shielding portions 5, thereby reducing the overall display quality of the liquid crystal display device 1'.

Figure 15:
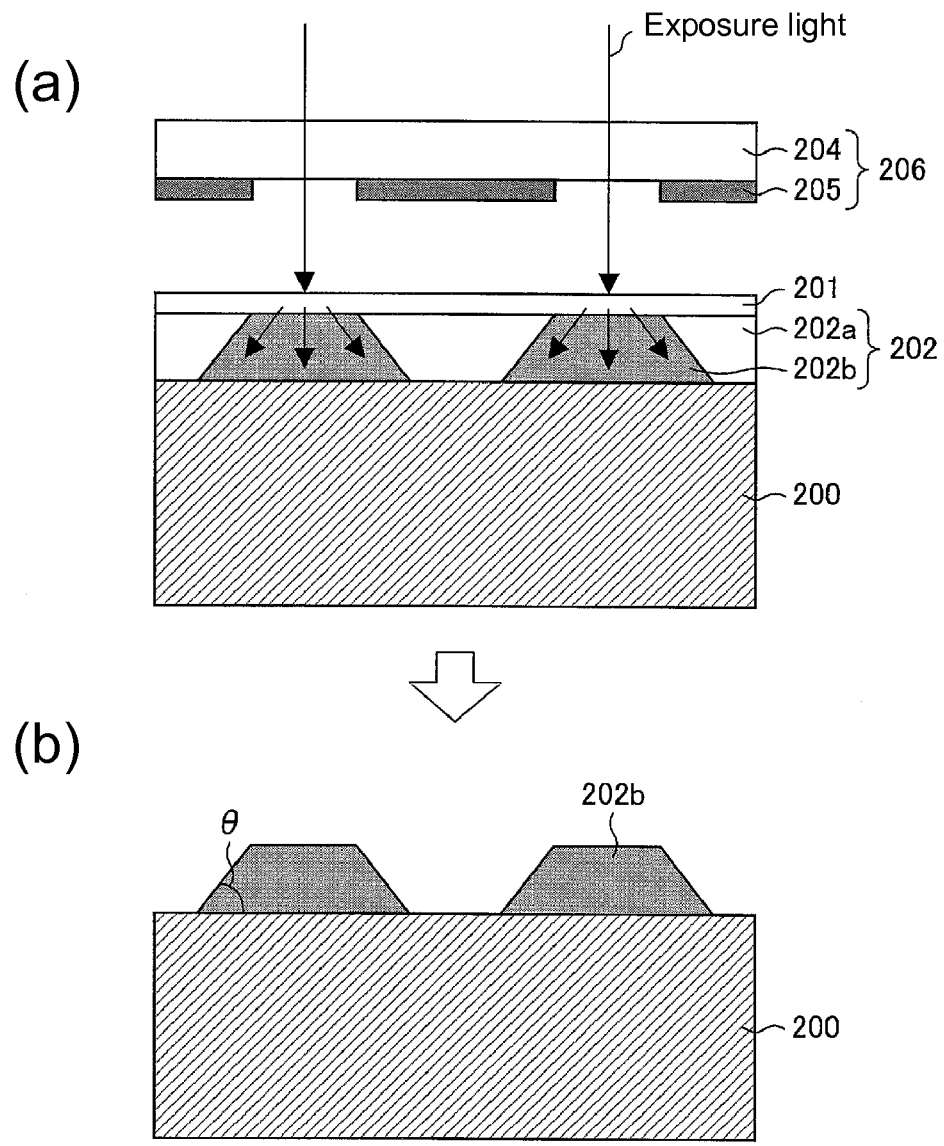
FIG. 15 contains two cross-sectional views schematically illustrating a method of manufacturing a relief printing plate disclosed in Patent Document 2.

This disruption in the orientation of the liquid crystal molecules occurs due to edges of the pattern used for the interlayer insulating film 23'. One possible solution for preventing this problem is to reduce the angle of inclination of the edges of the interlayer insulating film 23' (that is, the edges in the widthwise direction of the signal lines 24) with respect to the substrate surface. In order to do this, the relief printing plate disclosed in Patent Document 2 could be used, for example. More specifically, as shown in FIG. 15, the relief printing plate has a plurality of forward-tapered shapes.

Therefore, if this relief printing plate was used as an intaglio plate, the interlayer insulating film 23' would take on the corresponding (mirrored) forward-tapered shape, and the inclination of the edges of the interlayer insulating film 23' (that is, the edges in the widthwise direction of the signal lines 24) could be controlled. However, in the technology disclosed in the Patent Document 2, the angle of inclination θ of the protrusions in the plate is controlled using a photolithography method in which the concentration and particle diameter of fine light-diffusing particles contained in a light diffusing layer 201 are adjusted. As a result, the cost of manufacturing the plate using this method is high. Moreover, the relief printing plate is used as an intaglio plate, so the printing methods that can be used are limited to intaglio printing methods.

As the inventors researched solutions to the abovementioned problems, they found patterns for relief plates and intaglio plates for use in a printing method in which not only is a pattern printed along the signal lines 24, edge-softening patterns that reduce the inclination of the edges of that printed pattern are also printed. Moreover, the inventors found that such plates make it possible to cost-effectively pattern the interlayer insulating film 23' without any restrictions on the printing method used, thereby arriving at the present invention.

In other words, in the printing method used in the interlayer insulating film (SOG film) formation step S2 in the present method of manufacturing an active element substrate, the plates used have a configuration that includes: a main pattern that prints along the signal lines 24 that enclose the openings 6; and edge-softening patterns that reduce the inclination of the edges of the printed pattern (that is, the edges in the widthwise direction of the signal lines 24) formed by the main pattern.

As shown in FIG. 2(a), in the present embodiment the plate 50A that is used in the interlayer insulating film (SOG film) formation step S2 includes: a main pattern 52 that runs along the signal lines 24; and fine line patterns 53 that are slightly separated from both sides of the main pattern 52 in the widthwise direction of the signal lines 24. The main pattern 52 overlaps with the signal lines 24, which enclose the openings 6. Meanwhile, the fine line patterns 53 run parallel to the main pattern 52 but do not overlap with the signal lines 24. In the present method of manufacturing an active element substrate, the interlayer insulating film 23 is patterned using a printing method in which the plate 50A is brought into contact with the substrate 21. The signal lines 24, which are formed later, are formed in the contact region of the main pattern 52 of the plate 50A with the substrate 21 but do not extend into the contact regions of the fine line patterns 53 with the substrate 21.

Moreover, the main pattern 52 is at least as wide in the widthwise direction of the signal lines 24 as the minimum printable line width. Meanwhile, the fine line patterns 53 are thinner in the widthwise direction of the signal lines 24 than the minimum printable line width.

Therefore, when the interlayer insulating film 23 is patterned using the plate 50A, the pattern printed by the main pattern 52 (that is, the portion of the interlayer insulating film 23 that overlaps with the signal lines 24) maintains the line width of the main pattern 52. Meanwhile, the patterns printed by the fine line patterns 53 are thinner than the minimum printable line width and therefore cannot maintain the line width of the fine line patterns 53. As a result, the patterns printed by the fine line patterns 53 spread out and merge with the pattern printed by the main pattern 52. Therefore, the material in the pattern printed by the main pattern 52 flows into the patterns printed by the fine line patterns 53. As a result, as shown in FIG. 2(b), although the edges of the interlayer insulating film 23 extend into the boundary regions between the openings 6 and the light-shielding portions 5, these edges have a gently tapered shape with a small angle of inclination with respect to the surface of the substrate 21.

Accordingly, in the active element substrate 20 obtained after the interlayer insulating film (SOG film) formation step S2, the surface of the active element substrate 20 that is in contact with the liquid crystal layer 3 is tapered gently in the boundary regions between the openings 6 and the light-shielding portions 5. More specifically, the surface of the active element substrate 20 that is in contact with the liquid crystal layer 3 can be given an angle of inclination as small as approximately 5° with respect to the surface of the substrate 20 in the boundary regions between the openings 6 and the light-shielding portions 5. As a result, the surface of the active element substrate 20 that is in contact with the liquid crystal layer 3 can be made more uniform. Therefore, the orientation of the liquid crystal molecules in the liquid crystal layer 3 is less prone to disruption in the boundary regions between the openings 6 and the light-shielding portions 5, and the liquid crystal display device 1 is less prone to a reduction in overall display quality.

In order to reduce the (parasitic) capacitance that forms at the intersections between the scanning lines 22 and the signal lines 24, the interlayer insulating film 23 must have a certain minimum film thickness, and that film thickness must be uniform. In consideration of this requirement, the line width of the main pattern 52 may be at least as wide as the minimum printable line width, and the main pattern 52 may be formed only at the intersections between the scanning lines 22 and the signal lines 24. If the main pattern 52 is a straight line pattern with a line width smaller than the minimum line width or if that straight line pattern has regions in which several straight lines overlap, the film thickness of the interlayer insulating film 23 would be non-uniform or thinner than the minimum required film thickness at the intersections between the scanning lines 22 and the signal lines 24. As a result, it would not be possible to sufficiently reduce the (parasitic) capacitance that forms at the intersections between the scanning lines 22 and the signal lines 24.

Moreover, the angle of inclination of the edges of the interlayer insulating film 23 with respect to the substrate 21 can be adjusted by changing the distance between the main pattern 52 and the fine line patterns 53 or by changing the line width of the fine line patterns 53 in the plate 50A. For example, in the plate 50A, the distance between the fine line patterns 53 and the main pattern 52 can be set to a value of 5 µm to 25 µm, and the line width of the fine line patterns 53 can also be set to a value of 5 µm to 25 µm.

In this way, unlike the method disclosed in Patent Document 2 in which a relief printing plate is used as an intaglio plate, the method of manufacturing an active element substrate of the present embodiment does not rely on reducing the inclination of the edges of the interlayer insulating film 23 by mirroring the forward-tapered shape used on the printing plate. In other words, in the method of manufacturing an active element substrate of the present embodiment, the inclination of the edges of the interlayer insulating film 23 is controlled by the dimensions of the main pattern 52 and the fine line patterns 53 rather than by the shape of the plate 50A itself. Therefore, the plate 50A does not have a tapered cross-sectional shape. Instead, the plate 50A has a configuration with both surfaces that are parallel to the substrate 21 and surfaces that are perpendicular to the substrate 21. As a result, the production cost of the plate in the method of manufacturing an active element substrate of the present embodiment can be reduced. Moreover, the method of manufacturing an active element substrate of the present embodiment is not restricted by the structure of the plate or the printing scheme used. This allows the printing scheme used to pattern the interlayer insulating film 23 to be chosen more freely.

Figure 5:
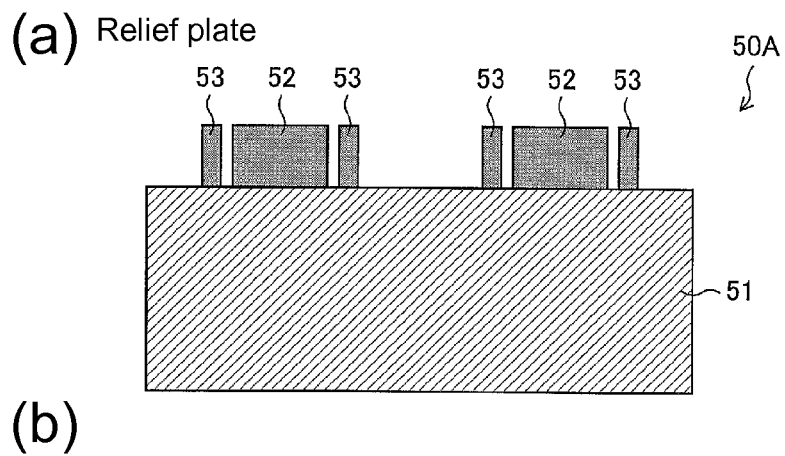
FIG. 5 shows cross-sectional views of plates that can be used in the process for forming an interlayer insulating film (SOG film) shown in FIG. 3(c).
Figure 5:
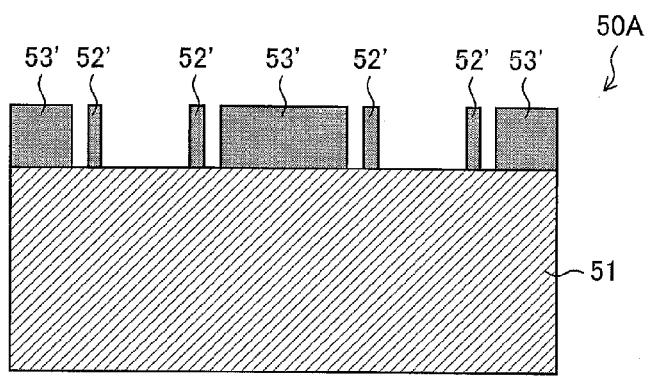

FIG. 5 shows cross-sectional views of plates that can be used in the method of manufacturing an active element substrate of the present embodiment. FIG. 5(a) illustrates a configuration in which the plate 50A is a relief plate, and FIG. 5(b) illustrates a configuration in which the plate 50A is an intaglio plate.

As shown in FIG. 5(a), when the plate 50A is a relief plate, the main pattern 52 is formed by protrusions that protrude out from a base material 51. Similarly, the fine line patterns 53 are also formed by protrusions that protrude out from the base material 51.

Moreover, as shown in FIG. 5(*b*), when the plate 50A is an intaglio plate, the main pattern 52 is formed by recessions formed using protrusions that protrude out from the base material 51. Similarly, the fine line patterns 53 are also formed by recessions formed using protrusions that protrude out from the base material 51.

In this way, in the method of manufacturing an active element substrate of the present embodiment, either a relief plate or an intaglio plate can be used for the plate 50A that is used in the interlayer insulating film (SOG film) formation step S2. Also, the printing scheme can be either a relief printing scheme or an intaglio printing scheme according to the structure of the plate 50A.

Figure 4:
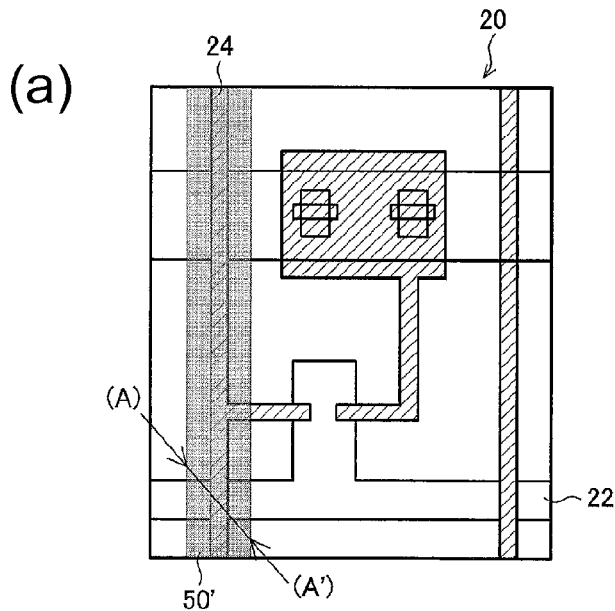
FIG. 4(a) is a plan view illustrating the configuration of an active element substrate in which a printing method is used to create a printed pattern along signal lines.
FIG. 4(b) is a cross-sectional view illustrating the configuration of a liquid crystal display device equipped with the active element substrate shown in FIG. 4(a).
Figure 4:
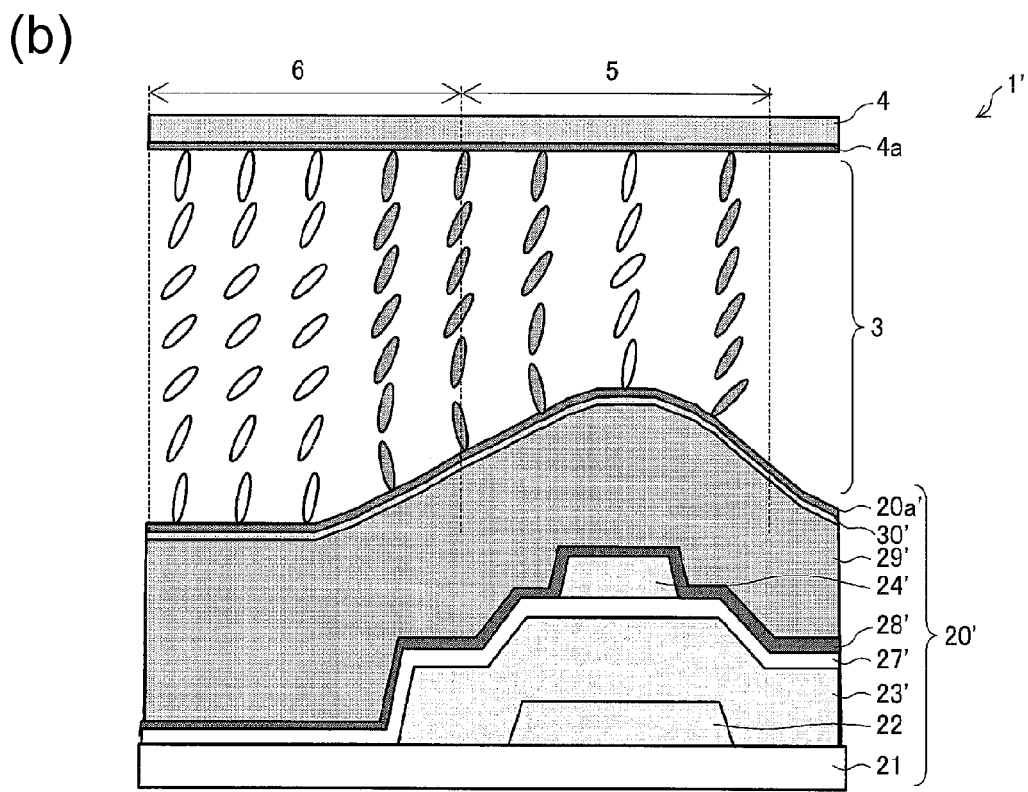
Figure 6:
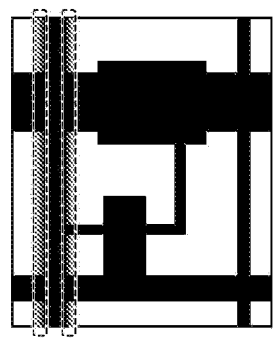
FIG. 6 shows two images of the liquid crystal display device shown in FIG. 4(b) in a state in which the display area is illuminated.
Figure 6:
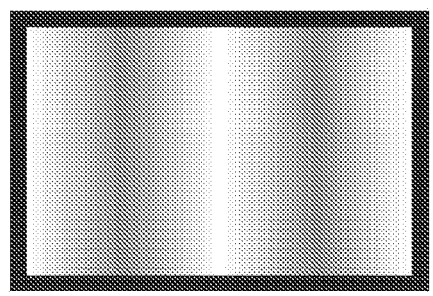

FIG. 6 shows two images of the liquid crystal display device 1' shown in FIG. 4(*b*) in a state in which the display area is illuminated. FIG. 6(*a*) is a plan view image showing a single pixel in a display state in which light is allowed to pass through, and FIG. 6(*b*) is a plan view image showing the panel in an illuminated state.

As shown in FIG. 6(*a*), the orientation of the liquid crystal molecules is disrupted near the edges of the pattern used for the interlayer insulating film 23 (that is, in the areas enclosed by the dotted lines), thereby reducing the transmittance in those areas. Furthermore, as shown in FIG. 6(*b*), the transmittance of the panel is non-uniform due to errors in positioning and line width of the printed pattern, thereby resulting in display irregularities.

Figure 7:
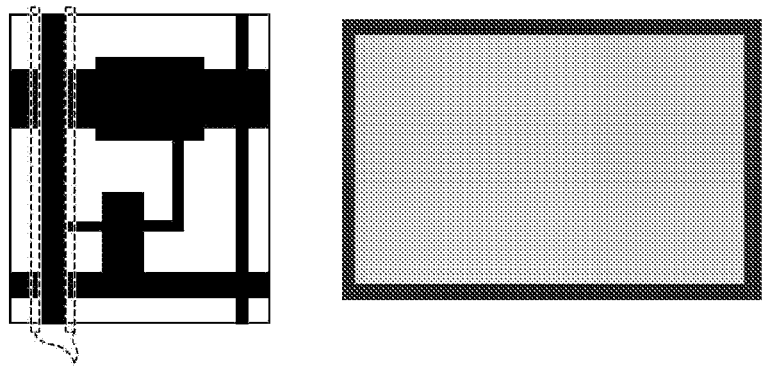
FIG. 7 shows two images of the liquid crystal display device shown in FIG. 2(b) in a state in which the display area is illuminated.

FIG. 7 shows two images of the liquid crystal display device 1 shown in FIG. 2(*b*) in a state in which the display area is illuminated. FIG. 7(*a*) is a plan view image showing a single pixel in a display state in which light is allowed to pass through, and FIG. 7(*b*) is a plan view image showing the panel in an illuminated state.

As shown in FIG. 7(*a*), in the liquid crystal display device 1 of the present embodiment, the orientation of the liquid crystal molecules is not disrupted near the edges of the pattern used for the interlayer insulating film 23 (that is, in the areas enclosed by the dotted lines) because those edges are tapered gently, and therefore the transmittance of those areas is not reduced. Furthermore, as shown in FIG. 7(*b*), the transmittance of the panel remains uniform even if there are errors in positioning or line width of the printed pattern, and therefore no display irregularities occur.

FIGS. 6 and 7 demonstrate that by using a printing method in which the plate 50A that has the main pattern 52 and the fine line patterns 53 is used to form the interlayer insulating film 23, the edges of the interlayer insulating film 23 can be given a gentle taper, and therefore a reduction in transmittance near those edges of the interlayer insulating film 23 can be prevented. Furthermore, because there is no reduction in transmittance resulting from the pattern used for the interlayer insulating film 23, non-uniformities in transmittance and the resulting display irregularities are less likely to manifest even if there are positioning or line width errors in the pattern printed for the interlayer insulating film 23.

Moreover, in the method of manufacturing an active element substrate of the present embodiment, the angle of inclination of the edges of the interlayer insulating film 23 can be controlled by changing the pattern of the plate 50A used to pattern the interlayer insulating film 23. Therefore, the angle of inclination of the edges of the interlayer insulating film 23 can be adjusted with more precision than in the method disclosed in Patent Document 2 in which a relief printing plate is used. In contrast, in the technology disclosed in Patent Document 2, the angle of inclination $\theta$ is controlled by using a photolithography process that takes advantage of the diffusion of light by the light diffusing layer 201 when forming the plate. Therefore, using the relief printing plate disclosed in Patent Document 2 does not allow precision control of the angle of inclination of the edges of the interlayer insulating film 23.

Figure 8:
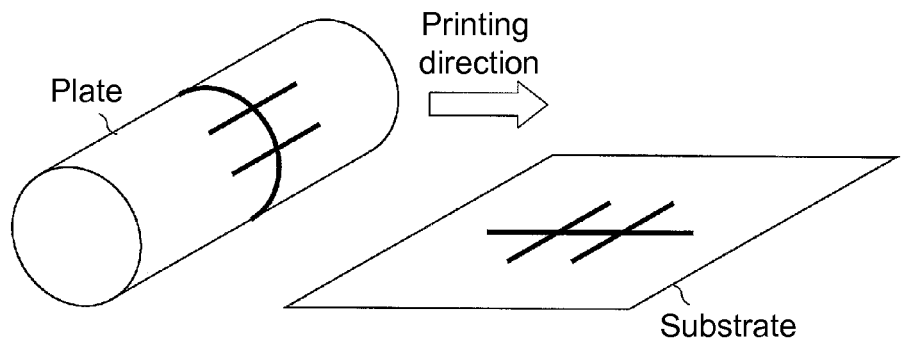
FIG. 8(a) illustrates the concept behind gravure offset printing.
FIG. 8(b) is a top view illustrating an example of a pattern printed using gravure offset printing.
Figure 8:
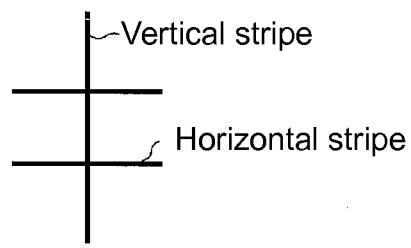

Moreover, an example of a printing technology that can be used to form the interlayer insulating film 23 using the plate 50A is gravure offset printing, for example. FIG. 8(*a*) illustrates the concept behind gravure offset printing. FIG. 8(*b*) is a top view illustrating an example of a pattern printed using gravure offset printing.

As shown in FIG. 8(*a*), gravure offset printing involves rolling (rotating) a roller-shaped plate on a substrate in order to print the desired pattern on the substrate. When using this printing technology to print the pattern shown in FIG. 8(*b*), for example, the vertical stripe portion of the pattern that runs parallel to the printing direction (the direction in which the plate rolls) can be printed continuously, and therefore the printing material can separate from the plate easily. However, the horizontal stripe portions of the pattern that are perpendicular to the printing direction are only printed intermittently. Therefore, the printing material separates less easily from the plate, and this portion of the pattern is more prone to interruptions.

Moreover, in the interlayer insulating film (SOG film) formation step of the present embodiment, the printing direction used when forming the interlayer insulating film 23 using the plate 50A is not particularly limited. When using the gravure offset printing technology illustrated in FIG. 8(*a*), for example, it is preferable that the printing direction used when forming the interlayer insulating film 23 using the plate 50A be parallel to the direction in which the signal lines 24 run. In other words, it is preferable that the vertical stripe portion of the pattern be used to form the interlayer insulating film 23 when using the plate 50A in the interlayer insulating film (SOG film) formation step. This increases the precision with which the printed pattern can be formed when printing the interlayer insulating film 23.

(Embodiment 2)

Another embodiment of the present invention will be described below with reference to FIGS. 9 to 12. For convenience, the same reference characters are used to indicate components that have the same functions as components described in the previous embodiment, and the description of those components will be omitted here.

Figure 9:
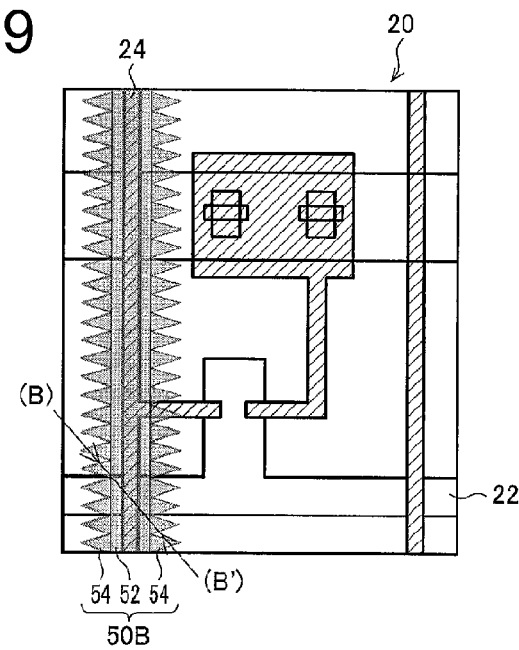
FIG. 9(a) is a plan view illustrating the configuration of an intersection between a scanning line and a signal line in an active element substrate produced using a manufacturing method according to Embodiment 2 of the present invention.
FIG. 9(b) is a cross-sectional view illustrating the configuration of a liquid crystal display device equipped with the active element substrate shown in FIG. 9(a).
Figure 9:
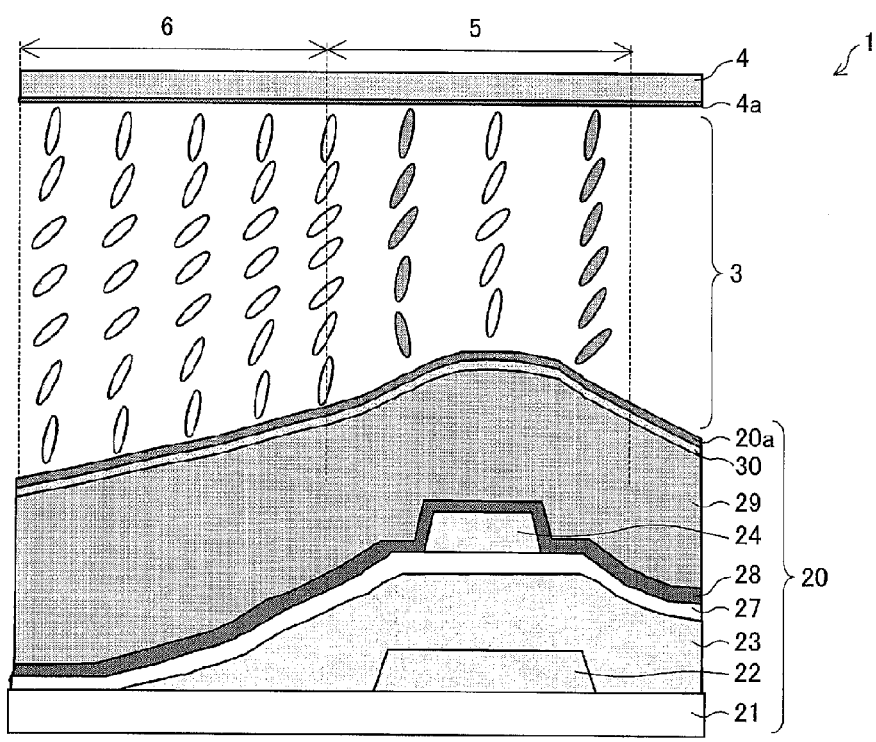
Figure 10:
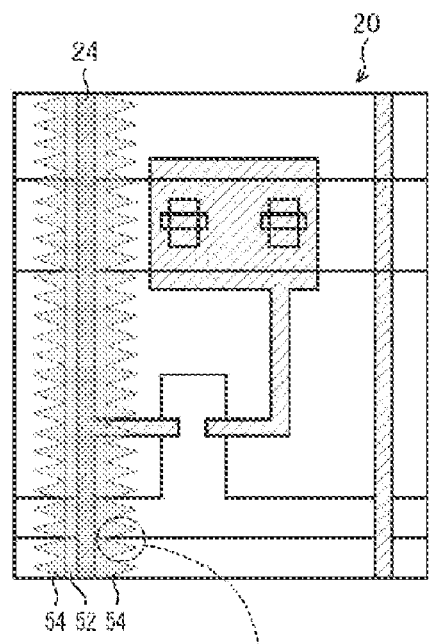
FIG. 10(a) is a plan view showing the overall configuration of the plate used in a manufacturing method according to Embodiment 2 of the present invention.
FIG. 10(b) is a plan view illustrating an interlayer insulating film patterned using a printing method in which the plate is used.
Figure 10:
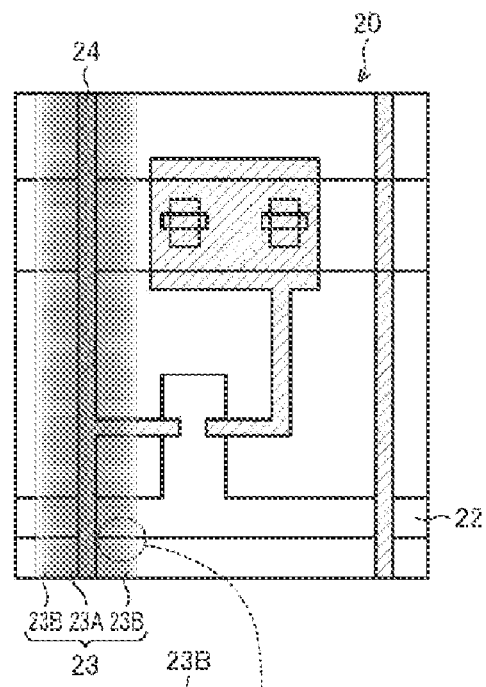
Figure 10:
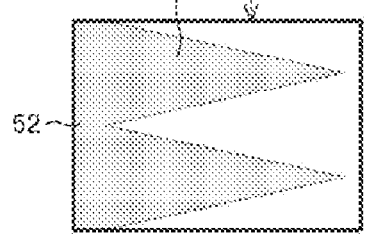
Figure 10:
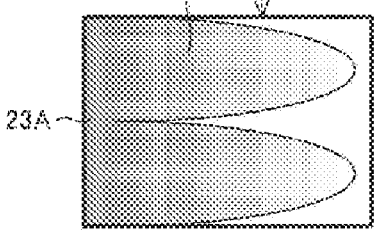
Figure 11:
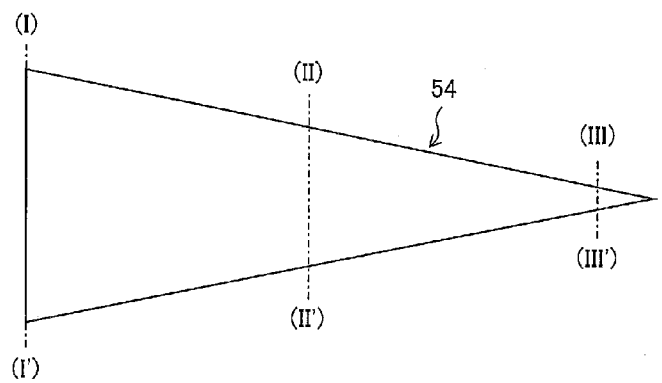
FIG. 11(a) is a top view showing the material used for the interlayer insulating film in the regions corresponding to the small protrusion patterns immediately after being printed using the plate. The three figures in FIG. 11(b) are cross-sectional views taken along line (I)-(I'), line (II)-(II'), and line (III)-(III'), respectively, in FIG. 11(a).
Figure 11:
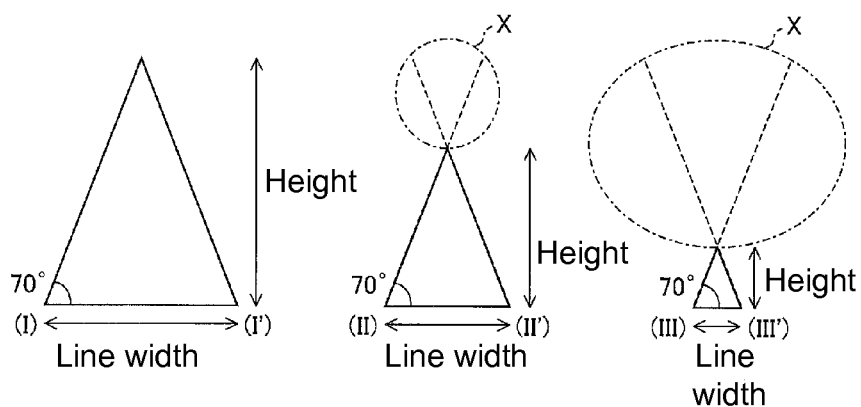

FIG. 9(*a*) is a plan view illustrating the configuration of an intersection between a scanning line and a signal line in an active element substrate produced using the manufacturing method of the present embodiment. FIG. 9(*b*) is a cross-sectional view illustrating the configuration of a liquid crystal display device equipped with the active element substrate shown in FIG. 9(*a*).

As shown in FIG. 9(*a*), a plate 50B that is used in an interlayer insulating film (SOG film) formation step S2 includes: a main pattern 52 that runs along signal lines 24; and small protrusion patterns 54 (edge-softening patterns) that protrude outwards from both sides of the main pattern 52 in the widthwise direction of the signal lines 24. The main pattern 52 overlaps with the signal lines 24, which enclose the openings 6. Meanwhile, the small protrusion patterns 54 do not overlap with the signal lines 24. In the method of manufacturing an active element substrate of the present embodiment, an interlayer insulating film 23 is patterned using a printing method in which the plate 50B is brought into contact with a substrate 21. The signal lines 24, which are formed later, are formed in the contact region of the main pattern 52 of the plate 50B with the substrate 21 but do not extend into the contact regions of the small protrusion patterns 54 with the substrate 21. Moreover, the main pattern 52 is at least as wide in the widthwise direction of the signal lines 24 as the minimum printable line width. Meanwhile, in the fine line patterns 54 that extend out in the widthwise direction of the signal lines 24, the line width of the base portions of the small protrusion patterns 54 (that is, the portions opposite to the end portions) are thinner in the direction in which the signal lines 24 run than the minimum printable line width. More specifically, the line width of the base portions of the small protrusion patterns 54 is 5 μm to 25 μm.

When the interlayer insulating film 23 is patterned using the plate 50B, the printed pattern 23A printed by the main pattern 52 (that is, the portion of the interlayer insulating film 23 that overlaps with the signal lines 24) maintains the line width of the main pattern 52. In contrast, the printed patterns 23B printed by the small protrusion patterns 54 cannot maintain the line width of the small protrusion patterns 54 and spread out.

FIG. 10(a) is a plan view showing the overall configuration of the plate 50B. FIG. 10(a) also includes an enlarged plan view of the small protrusion patterns 54 in the plate 50B. Moreover, FIG. 10(b) is a plan view illustrating the interlayer insulating film 23 patterned using a printing method in which the plate 50B is used. FIG. 10(b) also includes an enlarged plan view of a portion of the interlayer insulating film 23 patterned by the small protrusion patterns 54.

Here, when the plate 50B which has the small protrusion patterns 54 shown in FIG. 10(a) is used to pattern the interlayer insulating film 23, the printed patterns 23B printed by the small protrusion patterns 54 are thinner than the minimum printable line width in the direction in which the signal lines 24 run. Therefore, the printed patterns 23B cannot maintain the line width of the small protrusion patterns 54 and spread out. Furthermore, in the regions corresponding to the small protrusion patterns 54, the material used for the interlayer insulating film 23 spreads out, in the direction in which the signal lines 24 run, beyond the edges of the original small protrusion patterns 54. As a result, as shown in the enlarged plan view in FIG. 10(b), each of the printed patterns 23B spreads out in the direction in which the signal lines 24 run.

Moreover, the line width of the printed patterns 23B decreases moving from the base portions of the small protrusion patterns 54 towards the ends thereof. As a result, the overall height of the interlayer insulating film 23 decreases as both of the tapered edge portions of the patterns 23B printed by the small protrusion patterns 54 spread out equally. Next, this process will be described in more detail with reference to FIGS. 11(a) and 11(b).

FIG. 11(a) is a top view showing the material used for the interlayer insulating film 23 in the regions corresponding to the small protrusion patterns 54 immediately after being printed using the plate 50B. The three figures in FIG. 11(b) are cross-sectional views taken along line (I)-(I'), line (II)-(II'), and line (III)-(III'), respectively, in FIG. 11(a).

Here, assume that immediately after the interlayer insulating film 23 is printed, the taper angle between the edges of the interlayer insulating film 23 in the regions corresponding to the small protrusion patterns 54 and the printing surface of the active element substrate remains constant moving from the base portions to the end portions of the region corresponding to the small protrusion patterns 54. In the example shown in FIG. 11(b), this taper angle is 70°. In this case, the height of the interlayer insulating film 23 can be written as (line width)×tan (70°)/2. In other words, the height of the interlayer insulating film 23 is proportional to the line width. The height of the interlayer insulating film 23 decreases as the line width decreases. Therefore, as shown in FIG. 11(b), the height of the interlayer insulating film 23 in the cross-sectional views taken along lines (II)-(II') and (III)-(III') is less than the height of the interlayer insulating film 23 in the cross-sectional view taken along line (I)-(I') by a certain amount X. As a result, the height of the interlayer insulating film 23 in the regions corresponding to the small protrusion patterns 54 decreases moving from the base portions towards the end portions.

As a result, as shown in FIG. 9(b), although the edges of the interlayer insulating film 23 extend into the boundary regions between the openings 6 and the light-shielding portions 5, these edges have a gently tapered shape with a small angle of inclination with respect to the surface of the substrate 21.

Accordingly, in the active element substrate 20 obtained after the interlayer insulating film (SOG film) formation step S2, the surface of the active element substrate 20 that is in contact with the liquid crystal layer 3 is tapered gently in the boundary regions between the openings 6 and the light-shielding portions 5. As a result, the surface of the active element substrate 20 that is in contact with the liquid crystal layer 3 can be made more uniform. Therefore, the orientation of the liquid crystal molecules in the liquid crystal layer 3 is less prone to disruption in the boundary regions between the openings 6 and the light-shielding portions 5, and the liquid crystal display device 1 is less prone to a reduction in overall display quality.

Figure 12:
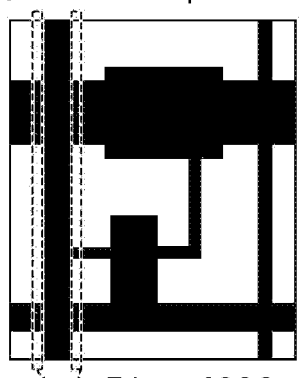
FIG. 12 shows two images of the liquid crystal display device shown in FIG. 9(b) in a state in which the display area is illuminated.
Figure 12:
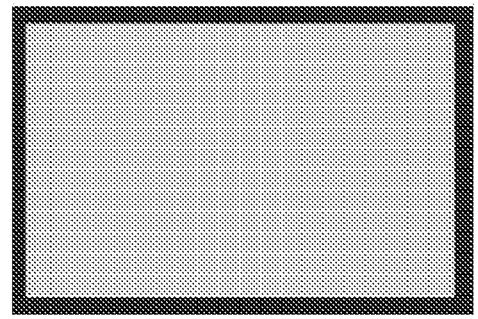

FIG. 12 shows two images of the liquid crystal display device 1 shown in FIG. 9(b) in a state in which the display area is illuminated. FIG. 12(a) is a plan view image showing a single pixel in a display state in which light is allowed to pass through, and FIG. 12(b) is a plan view image showing the panel in an illuminated state.

As shown in FIG. 12(a), in the liquid crystal display device 1 of the present embodiment, the orientation of the liquid crystal molecules is not disrupted near the edges of the pattern used for the interlayer insulating film 23 (that is, in the areas enclosed by the dotted lines) because those edges are tapered gently, and therefore the transmittance of those areas is not reduced. Furthermore, as shown in FIG. 12(b), the transmittance of the panel remains uniform even if there are errors in positioning or line width of the printed pattern, and therefore no display irregularities occur.

FIG. 12 demonstrates that by using a printing method in which the plate 50B that has the main pattern 52 and the small protrusion patterns 54 is used to form the interlayer insulating film 23, the edges of the interlayer insulating film 23 can be given a gentle taper, and therefore a reduction in transmittance near those edges of the interlayer insulating film 23 can be prevented. Furthermore, because there is no reduction in transmittance resulting from the pattern used for the interlayer insulating film 23, non-uniformities in transmittance and the resulting display irregularities are less likely to manifest even if there are positioning or line width errors in the pattern printed for the interlayer insulating film 23.

Moreover, in the interlayer insulating film (SOG film) formation step of the present embodiment, the printing direction used when forming the interlayer insulating film 23 using the plate 50B is not particularly limited. The printing direction may be parallel or perpendicular to the direction in which the signal lines 24 run. When using the gravure offset printing technology illustrated in FIG. 8(a), for example, it is preferable that the printing direction used when forming the interlayer insulating film 23 using the plate 50B be parallel to the direction in which the signal lines 24 run. In this case, as described above, the small protrusion patterns 54 (equivalent to the horizontal stripe portions in FIG. 8) are perpendicular to the printing direction and are only printed intermittently. Therefore, the printing material separates less easily from the plate, and this portion of the pattern is more prone to interruptions. As a result, from the perspective of aiming to increase printing precision for the patterns printed by the small protrusion patterns 54, it is preferable that the material used for the interlayer insulating film 23 separate easily from the plate 50B when the plate 50B is brought into contact with the printing surface of the active element substrate. This material can be selected as appropriate on the basis of the material used for the printing plate itself as well as the printing conditions used (such as the plate rotation speed, and the like).

(Embodiment 3)

Figure 13:
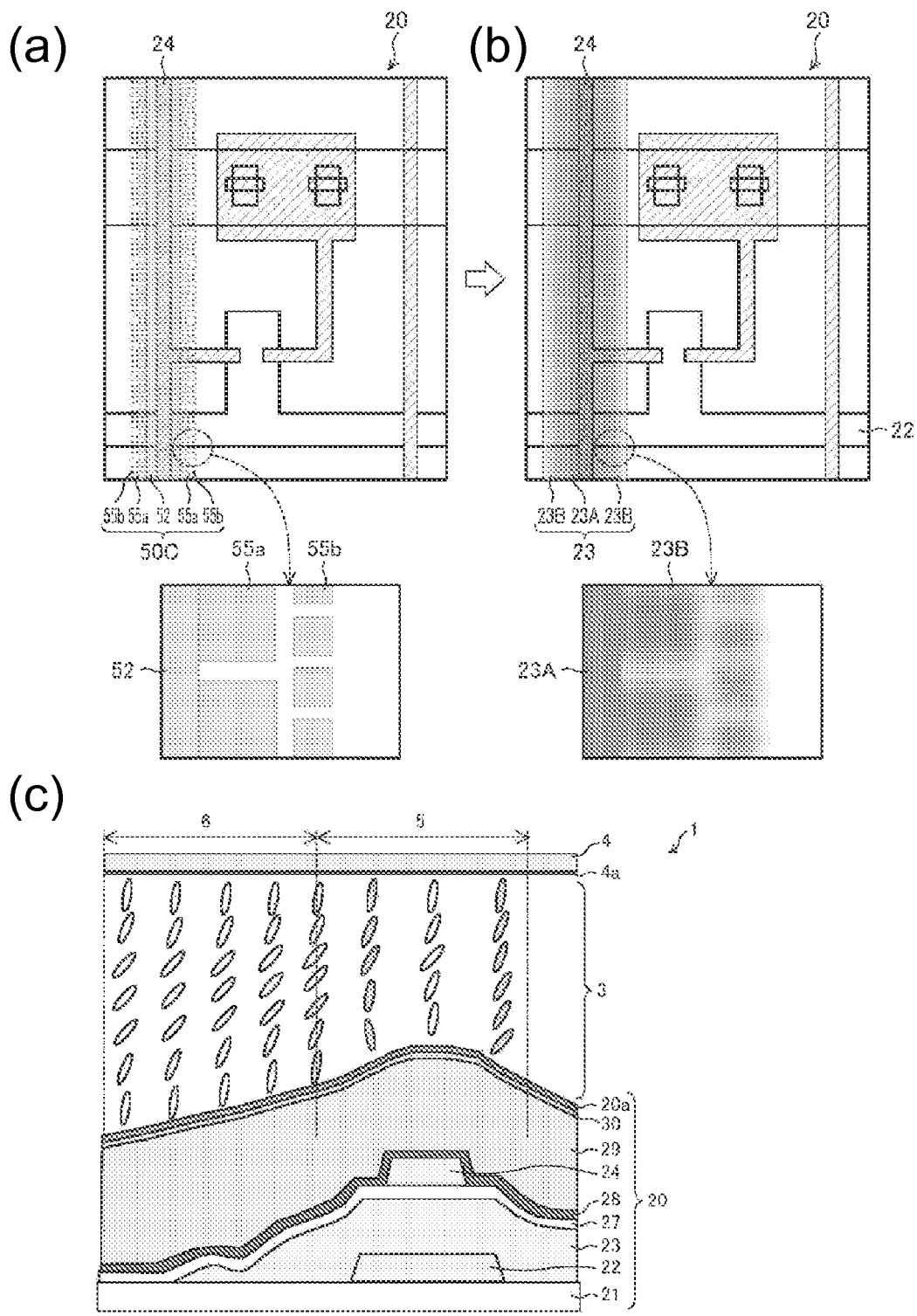
FIG. 13(a) is a plan view illustrating the configuration of an intersection between a scanning line and a signal line in an active element substrate produced using a manufacturing method according to Embodiment 3 of the present invention.
FIG. 13(b) is a plan view illustrating an interlayer insulating film patterned using a plate used in the manufacturing method according to Embodiment 3 of the present invention.
FIG. 13(c) is a cross-sectional view illustrating the configuration of a liquid crystal display device equipped with the active element substrate shown in FIG. 13(a).

Another embodiment of the present invention will be described below with reference to FIG. 13. For convenience, the same reference characters are used to indicate components that have the same functions as components described in the previous embodiments, and the description of those components will be omitted here.

FIG. 13(a) is a plan view illustrating the configuration of an intersection between a scanning line and a signal line in an active element substrate produced using the manufacturing method of the present embodiment. FIG. 13(b) is a plan view illustrating an interlayer insulating film patterned using a printing method in which a plate of the present embodiment is used. FIG. 13(c) is a cross-sectional view illustrating the configuration of a liquid crystal display device equipped with the active element substrate shown in FIG. 13(a). FIG. 13(a) also includes an enlarged plan view of small dot patterns in the plate. FIG. 13(b) also includes an enlarged plan view of a portion of the interlayer insulating film patterned by the small dot patterns.

As shown in FIG. 13(a), a plate 50C that is used in an interlayer insulating film (SOG film) formation step S2 includes: a main pattern 52 that runs along signal lines 24; and small dot patterns 55a and 55b (edge-softening patterns) on both sides of the main pattern 52 in the widthwise direction of the signal lines 24. The main pattern 52 overlaps with the signal lines 24, which enclose the openings 6. Meanwhile, the small dot patterns 55a and 55b do not overlap with the signal lines 24. In the method of manufacturing an active element substrate of the present embodiment, an interlayer insulating film 23 is patterned using a printing method in which the plate 50C is brought into contact with a substrate 21. The signal lines 24, which are formed later, are formed in the contact region of the main pattern 52 of the plate 50C with the substrate 21 but do not extend into the contact regions of the small dot patterns 55a and 55b with the substrate 21. Moreover, the main pattern 52 is at least as wide in the widthwise direction of the signal lines 24 as the minimum printable line width. Meanwhile, the dot diameters of the small dot patterns 55a and 55b are smaller than the minimum printable line width. Here, "dot diameter" refers to the diameters of the small dot patterns 55a and 55b when the small dot patterns 55a and 55b are circular, and to the side lengths of the small dot patterns 55a and 55b when the small dot patterns 55a and 55b are square-shaped.

Moreover, a plurality of the dots that form the small dot patterns 55a and 55b are formed in the direction in which the signal lines 24 run. A prescribed gap is left between adjacent dots in the small dot patterns 55a and between adjacent dots in the small dot patterns 55b. Moreover, the small dot patterns 55b are provided further outwards in the widthwise direction of the signal lines 24 than the small dot patterns 55a. Furthermore, the dot diameter of the small dot patterns 55a is larger than the dot diameter of the small dot patterns 55b. In other words, in the plurality of small dot patterns provided as edge-softening patterns in the plate 50C, the dot diameter of the small dot patterns decreases as the distance of the small dot patterns from the main pattern 52 increases.

When the interlayer insulating film 23 is patterned using the plate 50C, the printed pattern 23A printed by the main pattern 52 (that is, the portion of the interlayer insulating film 23 that overlaps with the signal lines 24) maintains the line width of the main pattern 52. Meanwhile, the dot diameters of the small dot patterns 55a and 55b are smaller than the minimum printable line width. Therefore, the printed patterns 23B printed by the small dot patterns 55a and 55b cannot maintain the original shapes of the small dot patterns 55a and 55b and spread out.

As shown in FIG. 13(b), the material used for the interlayer insulating film 23 spreads outwards from the edges of the dots printed by the small dot patterns 55a. Similarly, the material used for the interlayer insulating film 23 spreads outwards from the edges of the dots printed by the small dot patterns 55b. As a result, as shown in the enlarged plan view in FIG. 13(b), the material used for the interlayer insulating film 23 merges together between adjacent dots printed by the small dot patterns 55a. Similarly, the material used for the interlayer insulating film 23 merges together between adjacent dots printed by the small dot patterns 55b. Furthermore, the material used for the interlayer insulating film 23 merges together between the dots printed by the small dot patterns 55a and the dots printed by the small dot patterns 55b. As a result, in the printed pattern 23B, the height of the interlayer insulating film 23 decreases as the distance from the main pattern 52 in the widthwise direction of the signal lines 24 increases.

As a result, as shown in FIG. 13(c), although the edges of the interlayer insulating film 23 extend into the boundary regions between the openings 6 and the light-shielding portions 5, these edges have a gently tapered shape with a small angle of inclination with respect to the surface of the substrate 21.

Accordingly, in the active element substrate 20 obtained after the interlayer insulating film (SOG film) formation step S2, the surface of the active element substrate 20 that is in contact with the liquid crystal layer 3 is tapered gently in the boundary regions between the openings 6 and the light-shielding portions 5. As a result, the surface of the active element substrate 20 that is in contact with the liquid crystal layer 3 can be made more uniform. Therefore, the orientation of the liquid crystal molecules in the liquid crystal layer 3 is less prone to disruption in the boundary regions between the openings 6 and the light-shielding portions 5, and the liquid crystal display device 1 is less prone to a reduction in overall display quality.

Moreover, in the interlayer insulating film (SOG film) formation step of the present embodiment, the dot diameters of the dots in the small dot patterns 55a and 55b of the plate 50C are not particularly limited as long as the dot diameters are smaller than the minimum printable line width. The dot diameter of the dots on the printed pattern 23B corresponding to the small dot patterns 55a and 55b may be set relative for each dot.

(Embodiment 4)

Figure 14:
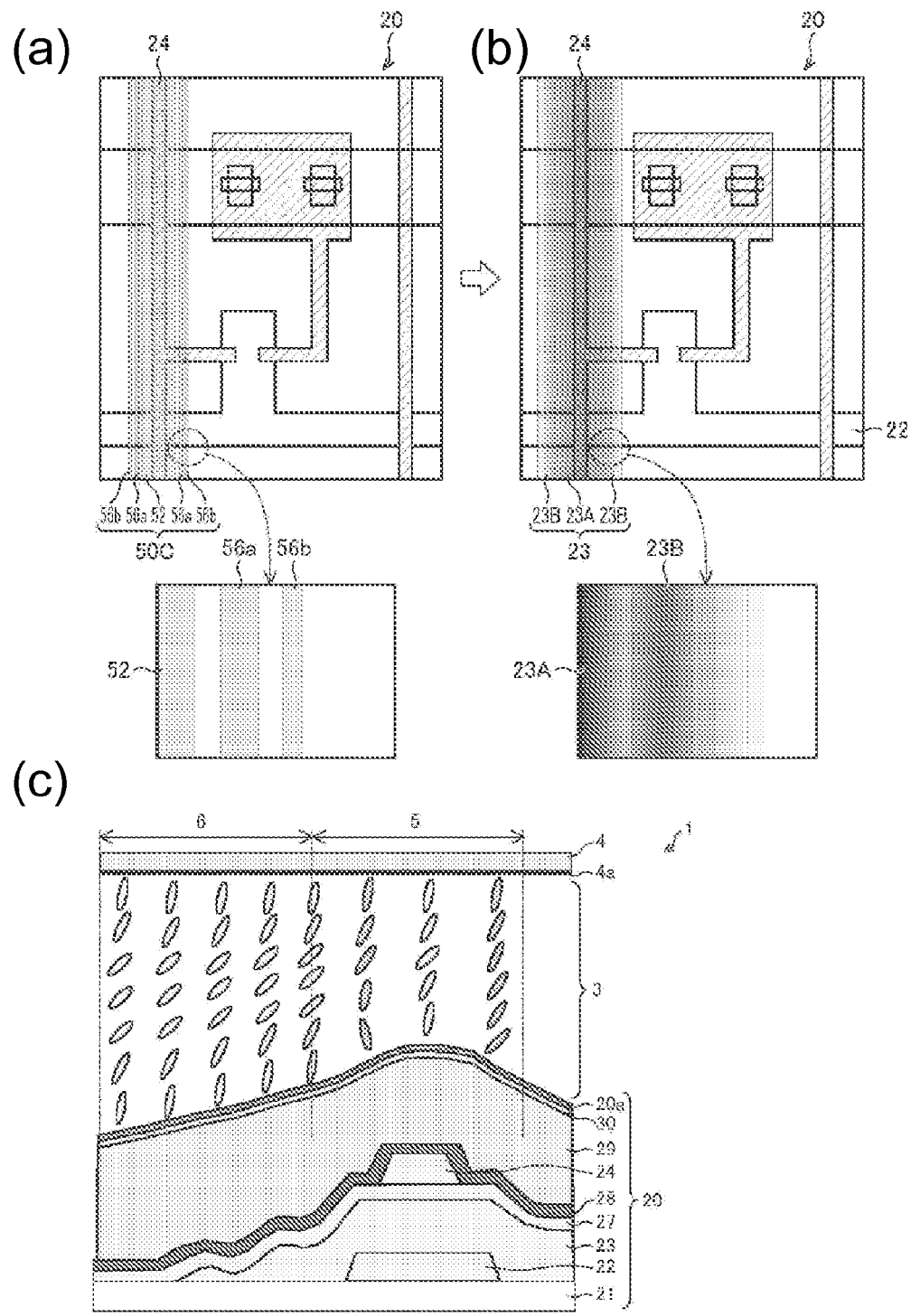
FIG. 14(a) is a plan view illustrating the configuration of an intersection between a scanning line and a signal line in an active element substrate produced using a manufacturing method according to Embodiment 4 of the present invention.
FIG. 14(b) is a plan view illustrating an interlayer insulating film patterned using a plate used in the manufacturing method according to Embodiment 4 of the present invention.
FIG. 14(c) is a cross-sectional view illustrating the configuration of a liquid crystal display device equipped with the active element substrate shown in FIG. 14(a).

Another embodiment of the present invention will be described below with reference to FIG. 14. For convenience, the same reference characters are used to indicate components that have the same functions as components described in the previous embodiments, and the description of those components will be omitted here.

FIG. 14(a) is a plan view illustrating the configuration of an intersection between a scanning line and a signal line in an active element substrate produced using the manufacturing method of the present embodiment. FIG. 14(b) is a plan view illustrating an interlayer insulating film patterned using a printing method in which a plate of the present embodiment is used. FIG. 14(c) is a cross-sectional view illustrating the configuration of a liquid crystal display device equipped with the active element substrate shown in FIG. 14(a). FIG. 14(a) also includes an enlarged plan view of fine line patterns in the plate. FIG. 14(b) also includes an enlarged plan view of a portion of the interlayer insulating film patterned by the fine line patterns.

As shown in FIG. 14(a), a plate 50D that is used in an interlayer insulating film (SOG film) formation step S2 includes: a main pattern 52 that runs along the signal lines 24; and fine line patterns 56a and 56b that are slightly separated from both sides of the main pattern 52 in the widthwise direction of the signal lines 24. The main pattern 52 overlaps with the signal lines 24, which enclose the openings 6. Meanwhile, the fine line patterns 56a and 56b both run parallel to the main pattern 52 but do not overlap with the signal lines 24. In the present method of manufacturing an active element substrate, an interlayer insulating film 23 is patterned using a printing method in which the plate 50D is brought into contact with a substrate 21. The signal lines 24, which are formed later, are formed in the contact region of the main pattern 52 of the plate 50D with the substrate 21 but do not extend into the contact regions of the fine line patterns 56a and 56b with the substrate 21.

Moreover, the main pattern 52 is at least as wide in the widthwise direction of the signal lines 24 as the minimum printable line width. Meanwhile, the fine line patterns 56a and 56b are thinner in the widthwise direction of the signal lines 24 than the minimum printable line width.

Moreover, the fine line patterns 56a and 56b are parallel to one another. Moreover, the fine line patterns 56b are provided further outwards in the widthwise direction of the signal lines 24 than the fine line patterns 56a. Furthermore, in the widthwise direction of the signal lines 24, the line width of the fine line patterns 56a is greater than the line width of the fine line patterns 56b. In other words, in the plurality of fine line patterns provided as edge-softening patterns in the plate 50D, the line width of the fine line patterns decreases as the distance of the fine line patterns from the main pattern 52 increases.

As shown in FIG. 14(b), when the interlayer insulating film 23 is patterned using the plate 50D, the printed pattern 23A printed by the main pattern 52 (that is, the portion of the interlayer insulating film 23 that overlaps with the signal lines 24) maintains the line width of the main pattern 52. Meanwhile, the printed patterns 23B printed by the fine line patterns 56a and 56b are thinner than the minimum printable line width and therefore cannot maintain the line width of the fine line patterns 56a and 56b. As a result, the printed patterns 23B spread out and merge with the printed pattern 23A printed by the main pattern 52. Therefore, the material in the pattern printed by the main pattern 52 flows into the patterns printed by the fine line patterns 56a and 56b. Moreover, as shown in the enlarged plan view in FIG. 14(b), the material used for the interlayer insulating film 23 merges together between the lines printed by the fine line patterns 56a and 56b in the printed pattern 23B. As a result, in the printed pattern 23B, the height of the interlayer insulating film 23 decreases as the distance from the main pattern 52 in the widthwise direction of the signal lines 24 increases.

As a result, as shown in FIG. 14(c), although the edges of the interlayer insulating film 23 extend into the boundary regions between the openings 6 and the light-shielding portions 5, these edges have a gently tapered shape with a small angle of inclination with respect to the surface of the substrate 21.

Accordingly, in the active element substrate 20 obtained after the interlayer insulating film (SOG film) formation step S2, the surface of the active element substrate 20 that is in contact with the liquid crystal layer 3 is tapered gently in the boundary regions between the openings 6 and the light-shielding portions 5. More specifically, the surface of the active element substrate 20 that is in contact with the liquid crystal layer 3 can be given an angle of inclination as small as approximately 5° with respect to the surface of the substrate 20 in the boundary regions between the openings 6 and the light-shielding portions 5. As a result, the surface of the active element substrate 20 that is in contact with the liquid crystal layer 3 can be made more uniform. Therefore, the orientation of the liquid crystal molecules in the liquid crystal layer 3 is less prone to disruption in the boundary regions between the openings 6 and the light-shielding portions 5, and the liquid crystal display device 1 is less prone to a reduction in overall display quality.

Moreover, in the interlayer insulating film (SOG film) formation step of the present embodiment, the angle of inclination of the edges of the interlayer insulating film 23 can be further decreased if the number of mutually parallel fine line patterns formed in the plate 50D is increased. The number of fine line patterns to form in the plate 50D can be set as appropriate on the basis of the space between the fine line patterns, the limits on the line widths that can be achieved using the selected printing device, or the like.

(Summary)

One aspect of the present invention is a method of manufacturing an active element substrate that has: a plurality of scanning lines formed on a substrate; a plurality of signal lines that intersect with the scanning lines; and a plurality of light-transmitting portions (the openings 6) in regions enclosed by the scanning lines and the signal lines, and a printing method in which a relief plate or an intaglio plate (the plates 50A and 50B) is employed is used in an interlayer insulating film formation step (the interlayer insulating film (SOG film) formation step S2) for forming an interlayer insulating film at least between the scanning lines and the signal lines, and the relief plate or the intaglio plate has: a main pattern that overlaps with the signal lines that enclose the light-transmitting portions; and edge-softening patterns (the fine line patterns 53, the small protrusion patterns 54) that reduce, in the widthwise direction of the signal lines, the inclination of the edges of the printed pattern printed by the main pattern.

Moreover, one aspect of the present invention is an active element substrate, including: a plurality of scanning lines formed on a substrate; a plurality of signal lines that intersect with the scanning lines; a plurality of light-transmitting portions in regions enclosed by the scanning lines and the signal lines; and an interlayer insulating film formed at least between the scanning lines and the signal lines. The printing method in which a relief plate or an intaglio plate is employed is used to form the interlayer insulating film, and the relief plate or the intaglio plate has: a main pattern that overlaps with the signal lines that enclose the light-transmitting portions; and edge-softening patterns that reduce, in the widthwise direction of the signal lines, the inclination of the edges of a printed pattern printed by the main pattern.

Moreover, one aspect of the present invention is a display device equipped with the abovementioned active element substrate.

In the conventional process for forming an interlayer insulating film, an insulating film material is applied to the scanning lines, and then photolithography and dry etching are used to pattern the insulating film material. This conventional process for forming an interlayer insulating film comes with high production costs because both the equipment and materials needed to form the interlayer insulating film are expensive.

In the abovementioned process for forming an interlayer insulating film of the present invention, the interlayer insulating film is formed at least between the scanning lines and the signal lines using a printing method in which a relief plate or an intaglio plate is used. Therefore, the production cost associated with this process is less than the production cost associated with the conventional process for forming an interlayer insulating film, in which photolithography and dry etching are used.

When using such a printing method in which a relief plate or an intaglio plate is used, the minimum line width and the precision with which the lines can be placed are roughly 10 times worse than in the conventional process described above in which photolithography and dry etching steps are used. This being the case, when the printed pattern for the interlayer insulating film is formed between the scanning lines and the signal lines using a relief plate or an intaglio plate having a main pattern that overlaps with the signal lines that enclose the light-transmitting portions, the printed pattern extends to the light-transmitting portions, and the edges of the printed pattern in the widthwise direction of the signal lines are inclined steeply. Furthermore, as layers are added on top of the interlayer insulating film to form the active element substrate, the surface of the active element substrate that is in contact with the liquid crystal layer becomes inclined in the regions of the light-transmitting portions near the signal lines. As a result, the orientation of the liquid crystal molecules in the liquid crystal layer is disrupted in these regions of the light-transmitting portions near the signal lines, thereby reducing the overall display quality of the display device.

In the method of manufacturing an active element substrate of the present invention, the interlayer insulating film is formed using a relief plate or an intaglio plate that includes: a main pattern that overlaps with the signal lines that enclose the light-transmitting portions; and edge-softening patterns (the fine line patterns 53, the small protrusion patterns 54) that reduce, in the widthwise direction of the signal lines, the inclination of the edges of the printed pattern printed by the main pattern. Therefore, the angle of inclination of the edges of the pattern printed for the interlayer insulating film (that is, the edges in the widthwise direction of the signal lines) can be reduced, and disruption of the orientation of the liquid crystal molecules resulting from the pattern used for the interlayer insulating film can be prevented.

Moreover, in the method of manufacturing an active element substrate according to one aspect of the present invention, it is preferable that the relief plate or the intaglio plate not have a tapered cross-sectional shape, and it is preferable that the relief plate or the intaglio plate have surfaces that are parallel to the contact surface of the substrate (that is, the substrate on which the scanning lines are formed) and surfaces that are perpendicular to the contact surface of that substrate.

In this method of manufacturing an active element substrate, the relief plate or the intaglio plate does not have a tapered cross-sectional shape, and the relief plate or the intaglio plate has surfaces that are parallel to the contact surface of the substrate (that is, the substrate on which the scanning lines are formed) and surfaces that are perpendicular to the contact surface of that substrate. Therefore, the costs associated with manufacturing the plate itself can be reduced.

Moreover, in the method of manufacturing an active element substrate according to one aspect of the present invention, it is preferable that the printed pattern printed by the relief plate or the intaglio plate not overlap with active elements or auxiliary capacitance lines of the active element substrate.

In this method of manufacturing an active element substrate, the printed pattern printed by the relief plate or the intaglio plate does not overlap with active elements or auxiliary capacitance lines of the active element substrate. Therefore, the (parasitic) capacitance that forms at the intersections between the scanning lines and the signal lines can be sufficiently reduced. As a result, latency in the source signals due to this (parasitic) capacitance can be reduced.

Moreover, in the method of manufacturing an active element substrate according to one aspect of the present invention, it is preferable that in the interlayer insulating film formation step, the interlayer insulating film be formed either along the signal lines that enclose the light-transmitting portions or at intersections between the scanning lines and the signal lines.

As noted above, when using such a printing method in which a relief plate or an intaglio plate is used, the minimum line width and the precision with which the lines can be placed are roughly 10 times worse than in a method in which photolithography and dry etching steps are used. In the abovementioned method of manufacturing an active element substrate according to one aspect of the present invention, in the interlayer insulating film formation step, the interlayer insulating film is formed either along the signal lines that enclose the light-transmitting portions or at intersections between the scanning lines and the signal lines. Therefore, the pattern printed using the printing method can be designed to include sufficient tolerances to allow for positioning errors in the pattern. In other words, in order to prevent problems that might occur due to positioning errors in the pattern, the interlayer insulating film can be designed to not overlap with the active elements or the auxiliary capacitance lines even if positioning errors occur.

Moreover, in the method of manufacturing an active element substrate according to one aspect of the present invention, it is preferable that the edge-softening patterns be separated from the main pattern, and it is preferable that the width of the edge-softening patterns in the widthwise direction of the signal lines be less than the minimum printable line width.

In this method of manufacturing an active element substrate, when the interlayer insulating film is patterned using the relief plate or the intaglio plate, the printed pattern printed by the main pattern maintains the line width of the main pattern. Meanwhile, the patterns printed by the edge-softening patterns are thinner than the minimum printable line width and therefore cannot maintain the line width of the edge-softening patterns. As a result, the patterns printed by the edge-softening patterns spread out and merge with the pattern printed by the main pattern. Therefore, the material in the pattern printed by the main pattern flows into the patterns printed by the edge-softening patterns. As a result, in this method of manufacturing an active element substrate, the edges of the interlayer insulating film have a gently tapered shape with a small angle of inclination.

Therefore, in the resulting active element substrate, the surface of the active element substrate that is in contact with the liquid crystal layer is inclined gently in the regions of the light-transmitting portions near the signal lines. As a result, the surface of the active element substrate that is in contact with the liquid crystal layer is more uniform. Therefore, the orientation of the liquid crystal molecules in the liquid crystal layer is less prone to disruption in the regions of the light-transmitting portions near the signal lines, and the liquid crystal display device is less prone to a reduction in overall display quality.

Furthermore, in a preferred embodiment of the method of manufacturing an active element substrate, the main pattern may be a straight line pattern that runs along the signal lines that enclose the light-transmitting portions, and the edge-softening patterns may be straight line patterns that run parallel to the main pattern.

Furthermore, in a preferred embodiment of the method of manufacturing an active element substrate, it is preferable that the edge-softening patterns include a plurality of mutually parallel straight line patterns, and it is preferable that the line width of each straight line pattern decrease as the distance from the main pattern to that straight line pattern increases. In this method of manufacturing an active element substrate, the edge-softening patterns include a plurality of mutually parallel straight line patterns, and the line width of each straight line pattern decreases as the distance from the main pattern to that straight line pattern increases. Therefore, the angle of inclination of the edges of the interlayer insulating film can be controlled by adjusting the line width of each straight line pattern as appropriate.

Moreover, in the method of manufacturing an active element substrate according to one aspect of the present invention, it is preferable that the edge-softening patterns be small protrusion patterns that protrude outwards from both sides of the main pattern in the widthwise direction of the signal lines, and it is preferable that the line width of the base portions that are opposite to the tips of the small protrusions (that is, the line width in the direction in which the signal lines 24 run) be less than the minimum printable line width.

When the interlayer insulating film is patterned using the relief plate or the intaglio plate, the printed pattern printed by the main pattern maintains the line width of the main pattern. Meanwhile, in this method of manufacturing an active element substrate, small protrusion patterns are used for the edge-softening patterns. The line width of the base portions that are opposite to the tips of the small protrusions is less than the minimum printable line width. Therefore, the printed patterns printed by the small protrusion patterns cannot maintain the original shapes of those small protrusion patterns. Furthermore, in the regions corresponding to the small protrusion patterns, the material used for the interlayer insulating film spreads out, in the direction in which the signal lines run, beyond the edges of the original small protrusion patterns. As a result, the printed patterns printed by the small protrusion patterns spread out in the direction in which the signal lines run. Therefore, the edges of adjacent printed patterns printed by the small protrusion patterns spread out equally, and the height of the interlayer insulating film decreases moving from the base portions towards the end portions of the small protrusion patterns. As a result, in this method of manufacturing an active element substrate, the edges of the interlayer insulating film have a gently tapered shape with a small angle of inclination.

Furthermore, in a preferred embodiment of the method of manufacturing an active element substrate, the main pattern may be a straight line pattern that runs along the signal lines that enclose the light-transmitting portions, and the small protrusion pattern may protrude outwards from both sides of the straight line pattern in the widthwise direction of the signal lines.

Moreover, in method of manufacturing an active element substrate according to one aspect of the present invention, it is preferable that the edge-softening patterns be small dot patterns that have a plurality of dots that are aligned in the direction in which the signal lines run, and it is preferable that the dot diameter of each dot be less than the minimum printable line width.

When the interlayer insulating film is patterned using the relief plate or the intaglio plate, the printed pattern printed by the main pattern maintains the line width of the main pattern. Meanwhile, in this method of manufacturing an active element substrate, the edge-softening patterns are small dot pattern that have a plurality of dots that are aligned in the direction in which the signal lines run, and the dot diameter of each dot is less than the minimum printable line width. Therefore, the printed patterns printed by the small dot patterns cannot maintain the original shapes of those small dot patterns and spread out. Furthermore, the material used for the interlayer insulating film spreads outwards from the edges of the dots printed by the small dot patterns. The material used for the interlayer insulating film merges together between adjacent dots in the printed patterns printed by the small dot patterns. As a result, the height of the interlayer insulating film decreases as the distance from the main pattern in the widthwise direction of the signal lines increases. As a result, in this method of manufacturing an active element substrate, the edges of the interlayer insulating film have a gently tapered shape with a small angle of inclination.

Moreover, in the method of manufacturing an active element substrate according to one aspect of the present invention, it is preferable that an insulating material that contains an organic ingredient be used as the material for the interlayer insulating film. This makes it possible to further reduce the (parasitic) capacitance that forms at the intersections between the scanning lines and the signal lines sufficiently.

In a preferred embodiment of this method of manufacturing an active element substrate, a spin-on glass (SOG) material may be used for the insulating material.

One aspect of the present invention is an active element substrate, including: a plurality of scanning lines formed on a substrate; a plurality of signal lines that intersect with the scanning lines; a plurality of light-transmitting portions in regions enclosed by the scanning lines and the signal lines; and an interlayer insulating film formed at least between the scanning lines and the signal lines. A printing method in which a relief plate or an intaglio plate is employed is used to form the interlayer insulating film, and the relief plate or the intaglio plate has: a main pattern that overlaps with the signal lines that enclose the light-transmitting portions; and edge-softening patterns that reduce, in a widthwise direction of the signal lines, an inclination of the edges of a printed pattern printed by the main pattern.

The present invention is not limited to the embodiments described above, and various modifications can be made without departing from the scope of the claims. Therefore, embodiments obtained by appropriately combining the techniques disclosed in different embodiments are included in the technical scope of the present invention. Furthermore, the techniques disclosed in each embodiment can be combined to achieve new technical features.

INDUSTRIAL APPLICABILITY

The substrate of the present invention is suitable for use in a display device such as a liquid crystal display device. Such a display device is widely suitable for use in office automation equipment such as personal computers, audio-visual devices such as televisions, and general electronic devices such as mobile telephones, for example.

DESCRIPTION OF REFERENCE CHARACTERS 1 liquid crystal display device
20 active element substrate
20a alignment film
21 substrate
22 scanning line
23 interlayer insulating layer
23A printed pattern (printed pattern printed by the main pattern)
23B printed pattern (printed pattern printed by the edge-softening pattern)
24 signal line
25 TFT (active element)
26 pixel electrode
27 gate insulating film
28 passivation film
29 transparent insulating film
30 transparent conductive film
3 liquid crystal layer
4 opposite substrate
5 light-shielding portion
6 opening (allows light to pass through)
41 alignment film
50A plate (relief plate or intaglio plate)
50B plate (relief plate or intaglio plate)
50C plate (relief plate or intaglio plate)
50D plate (relief plate or intaglio plate)
52 main pattern
53 fine line pattern (edge-softening pattern)
54 small protrusion pattern (edge-softening pattern)
55a, 55b small dot pattern (edge-softening pattern)
56a, 56b fine line pattern (edge-softening pattern)
S2 interlayer insulating film (SOG film) formation step (interlayer insulating film formation step)

What is claimed is:

1. A method of manufacturing an active element substrate that has a plurality of scanning lines formed on a substrate, a plurality of signal lines that intersect with the scanning lines, and a plurality of light-transmissive portions in regions enclosed by the scanning lines and the signal lines, the method comprising:
   preparing said substrate having the plurality of said scanning lines, the plurality of said signal lines, and the plurality of said light-transmissive portions; and
   printing an interlayer insulating film at intersections between the scanning lines and the signal lines, using a relief plate or an intaglio plate,
   wherein the relief plate or the intaglio plate has:
      a main pattern at locations overlapping the respective signal lines; and
      edge-softening patterns that reduce, in a widthwise direction of the signal lines, an inclination of edges of a pattern printed by the main pattern,
   wherein the relief plate or the intaglio plate does not have a tapered cross-sectional shape, and
   wherein the relief plate or the intaglio plate has surfaces that are parallel to a contact surface of the substrate and surfaces that are perpendicular to the contact surface of the substrate.

2. The method of manufacturing an active element substrate according to claim 1, wherein a pattern printed by the relief plate or the intaglio plate does not overlap with active elements or auxiliary capacitance lines of the active element substrate.

3. The method of manufacturing an active element substrate according to claim 1, wherein in the step of forming the interlayer insulating film, the interlayer insulating film is formed along an entire length of the signal lines.

4. The method of manufacturing an active element substrate according to claim 1,
   wherein the edge-softening patterns are small dot patterns that include a plurality of dots that are aligned in a direction in which the signal lines run, and
   wherein a dot diameter of each dot is less than a minimum printable line width.

5. The method of manufacturing an active element substrate according to claim 1, wherein an insulating material that contains an organic ingredient is used as a material for the interlayer insulating film.

6. The method of manufacturing an active element substrate according to claim 5, wherein a spin-on glass material is used for the insulating material.

7. A method of manufacturing an active element substrate that has a plurality of scanning lines formed on a substrate, a plurality of signal lines that intersect with the scanning lines, and a plurality of light-transmissive portions in regions enclosed by the scanning lines and the signal lines, the method comprising:
   preparing said substrate having a plurality of said scanning lines, the plurality of said signal lines, and the plurality of said light-transmissive portions; and
   printing an interlayer insulating film at intersections between the scanning lines and the signal lines, using a relief plate or an intaglio plate,
   wherein the relief plate or the intaglio plate has:
      a main pattern at locations overlapping the respective signal lines; and
      edge-softening patterns that reduce, in a widthwise direction of the signal lines, an inclination of edges of a pattern printed by the main pattern,
   wherein the edge-softening patterns are separated from the main pattern, and
   wherein a width of the edge-softening patterns in the widthwise direction of the signal lines is less than a minimum printable line width.

8. The method of manufacturing an active element substrate according to claim 7,
   wherein the main pattern is a straight line pattern that runs along the signal lines, and
   wherein the edge-softening patterns are straight line patterns that run parallel to the main pattern.

9. The method of manufacturing an active element substrate according to claim 7,
   wherein the edge-softening patterns include a plurality of mutually parallel straight line patterns, and
   wherein a line width of each straight line pattern decreases as a distance from the main pattern to the corresponding straight line pattern increases.

10. A method of manufacturing an active element substrate that has a plurality of scanning lines formed on a substrate, a plurality of signal lines that intersect with the scanning lines, and a plurality of light-transmissive portions in regions enclosed by the scanning lines and the signal lines, the method comprising:
   preparing said substrate having the plurality of said scanning lines, the plurality of said signal lines, and the plurality of said light-transmissive portions; and printing an interlayer insulating film at intersections between the scanning lines and the signal lines, using a relief plate or an intaglio plate, wherein the relief plate or the intaglio plate has:
- a main pattern at locations overlapping the respective signal lines; and
- edge-softening patterns that reduce, in a widthwise direction of the signal lines, an inclination of edges of a pattern printed by the main pattern, wherein the edge-softening patterns are small protrusion patterns that protrude outwards from both sides of the main pattern in the widthwise direction of the signal lines, and wherein a line width of base portions that are opposite to tips of the small protrusions is less than a minimum printable line width.

11. The method of manufacturing an active element substrate according to claim 10, wherein the main pattern is a straight line pattern that runs along the signal lines, and wherein the small protrusion patterns protrude outwards from both sides of the straight line pattern in the widthwise direction of the signal lines.

\* \* \* \* \*